United States Patent
Chen et al.

(10) Patent No.: US 10,217,518 B1
(45) Date of Patent: Feb. 26, 2019

(54) REDUCING HOT ELECTRON INJECTION TYPE OF READ DISTURB IN 3D MEMORY DEVICE HAVING CONNECTED SOURCE-END SELECT GATES

(71) Applicant: SanDisk Technologies LLC, Plano, TX (US)

(72) Inventors: Hong-Yan Chen, San Jose, CA (US); Yingda Dong, San Jose, CA (US)

(73) Assignee: SanDisk Technologies LLC, Addison, TX (US)

( * ) Notice: Subject to any disclaimer, the term of this patent is extended or adjusted under 35 U.S.C. 154(b) by 0 days.

(21) Appl. No.: 15/678,683

(22) Filed: Aug. 16, 2017

(51) Int. Cl.
| | | |
|---|---|---|
| *G11C 16/34* | (2006.01) | |
| *G11C 16/08* | (2006.01) | |
| *G11C 16/28* | (2006.01) | |
| *G11C 16/04* | (2006.01) | |
| G11C 16/30 | (2006.01) | |

(52) U.S. Cl.
CPC ...... *G11C 16/3427* (2013.01); *G11C 16/0483* (2013.01); *G11C 16/08* (2013.01); *G11C 16/28* (2013.01); *G11C 16/3459* (2013.01); *G11C 16/30* (2013.01)

(58) Field of Classification Search
CPC . G11C 16/3427; G11C 16/0483; G11C 16/08; G11C 16/28; G11C 16/3459; G11C 16/30
USPC ............ 365/185.17, 185.13, 185.02, 185.11, 365/185.22
See application file for complete search history.

(56) References Cited

U.S. PATENT DOCUMENTS

| | | |
|---|---|---|
| 7,852,675 B2 | 12/2010 | Maejima |
| 8,670,285 B2 | 3/2014 | Dong et al. |
| 9,336,892 B1 * | 5/2016 | Chen .................. G11C 11/5628 |
| 9,361,993 B1 * | 6/2016 | Chen ..................... G11C 16/14 |
| 9,412,463 B1 | 8/2016 | Chen et al. |
| 9,679,662 B1 | 6/2017 | Hashimoto |

(Continued)

OTHER PUBLICATIONS

U.S. Appl. No. 15/383,852, filed Dec. 19, 2016, by Chen et al., entitled "Reducing Hot Electron Injection Type of Read Disturb During Read Recovery Phase in 3D Memory."

(Continued)

*Primary Examiner* — Tha-O H Bui
*Assistant Examiner* — Alfredo Bermudez Lozada
(74) *Attorney, Agent, or Firm* — Vierra Magen Marcus LLP

(57) ABSTRACT

A memory device and associated techniques for reducing read disturb of memory cells during a sensing process. The drain-end select gate transistors of unselected sub-blocks are made temporarily conductive for a time period during the ramp up of the unselected word line voltages to reduce the amount of capacitive coupling up of the respective memory string channel. This reduces a channel gradient which can exist in the memory string channels, thereby also reducing the read disturb. Further, the time period is greater when the selected word line is in a source-end or midrange subset of the word lines than when the selected word line is in a drain-end subset of the word lines. Another option involves omitting the injection disturb countermeasure, or providing a less severe injection disturb countermeasure, when the unselected sub-blocks are unprogrammed.

20 Claims, 19 Drawing Sheets

(56) References Cited

U.S. PATENT DOCUMENTS

2013/0201760 A1* 8/2013 Dong .................. G11C 11/5642
  365/185.17
2015/0078089 A1   3/2015 Sakui
2016/0111167 A1   4/2016 Pan et al.

OTHER PUBLICATIONS

U.S. Appl. No. 15/172,653, filed Jun. 3, 2016, by Chen et al., entitled "Non-volatile Memory With Customized Control of Injection Type of Disturb During Program Verify for Improved Program Performance."
International Search Report & The Written Opinion of the International Searching Authority dated Oct. 10, 2018, International Application No. PCT/US2018/032525 by SanDisk Technologies LLC.

* cited by examiner

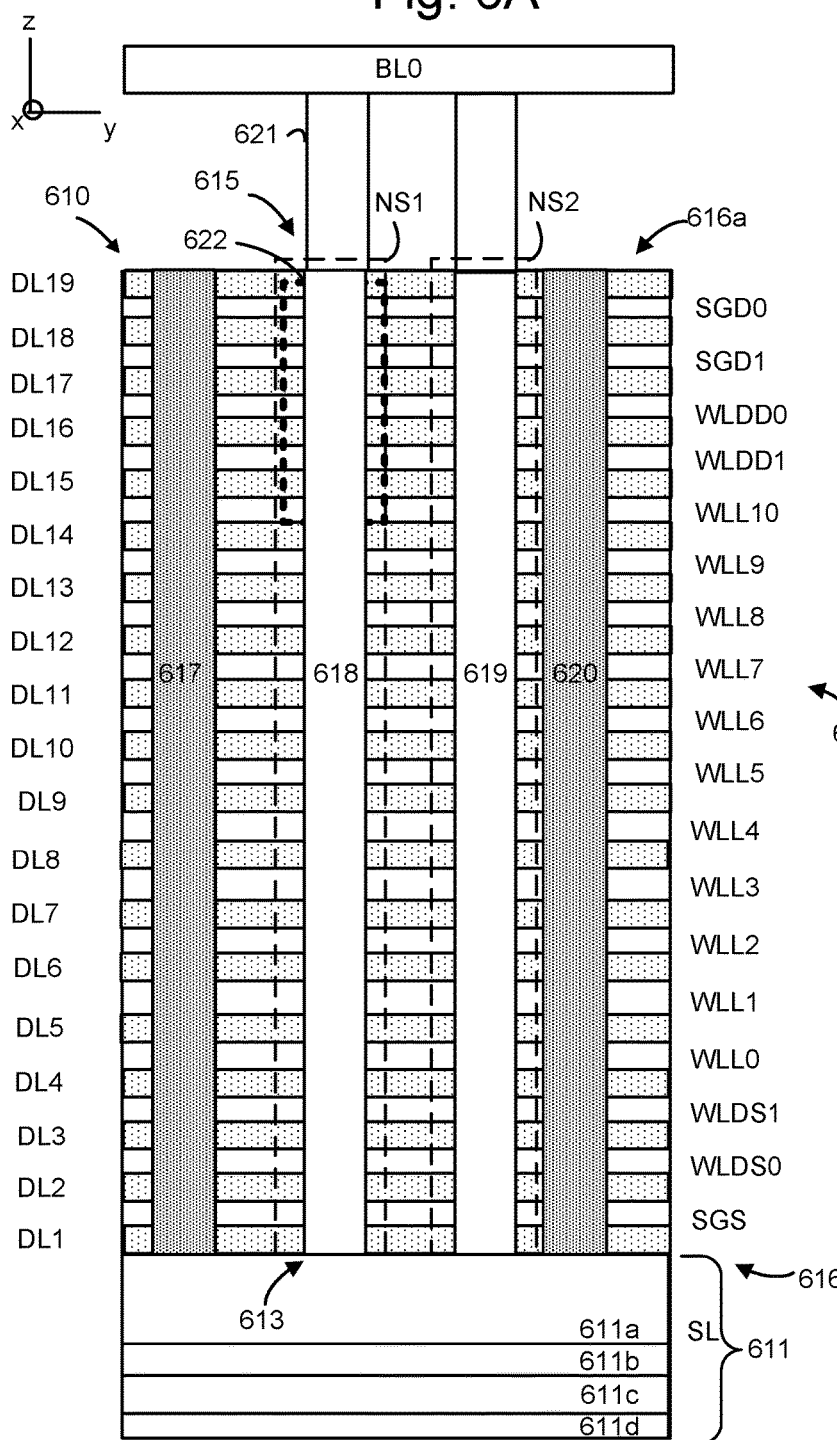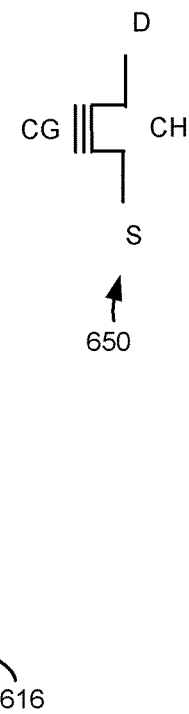

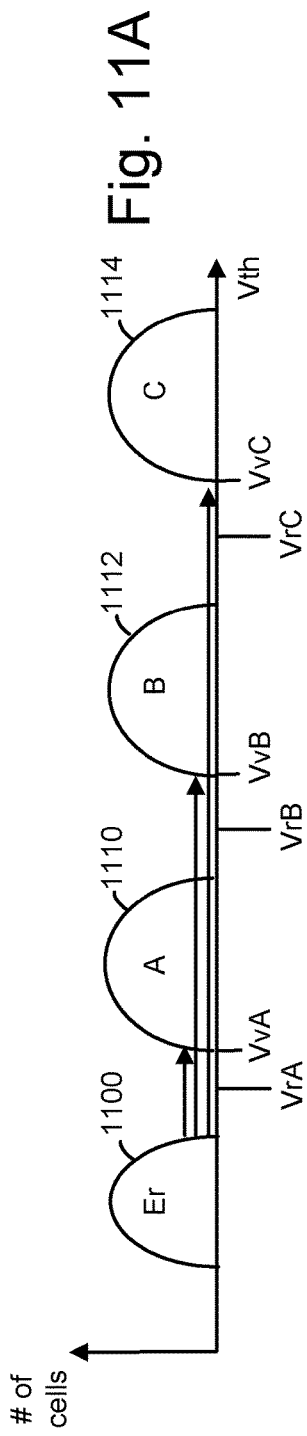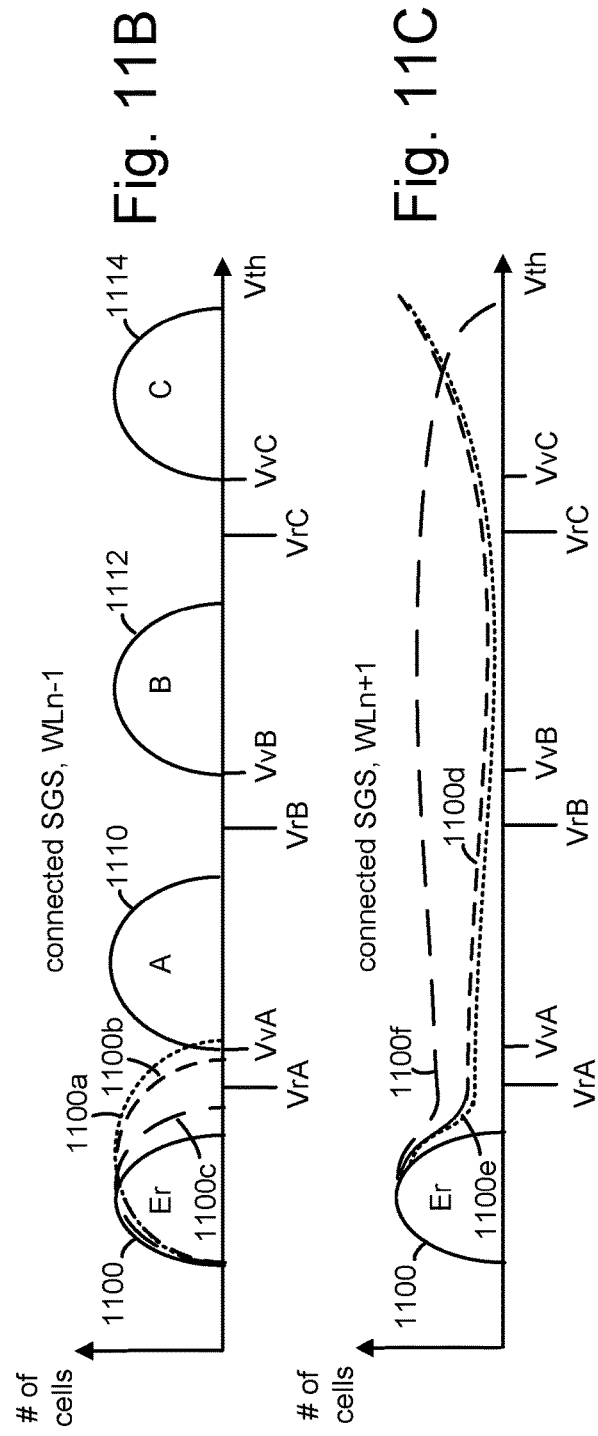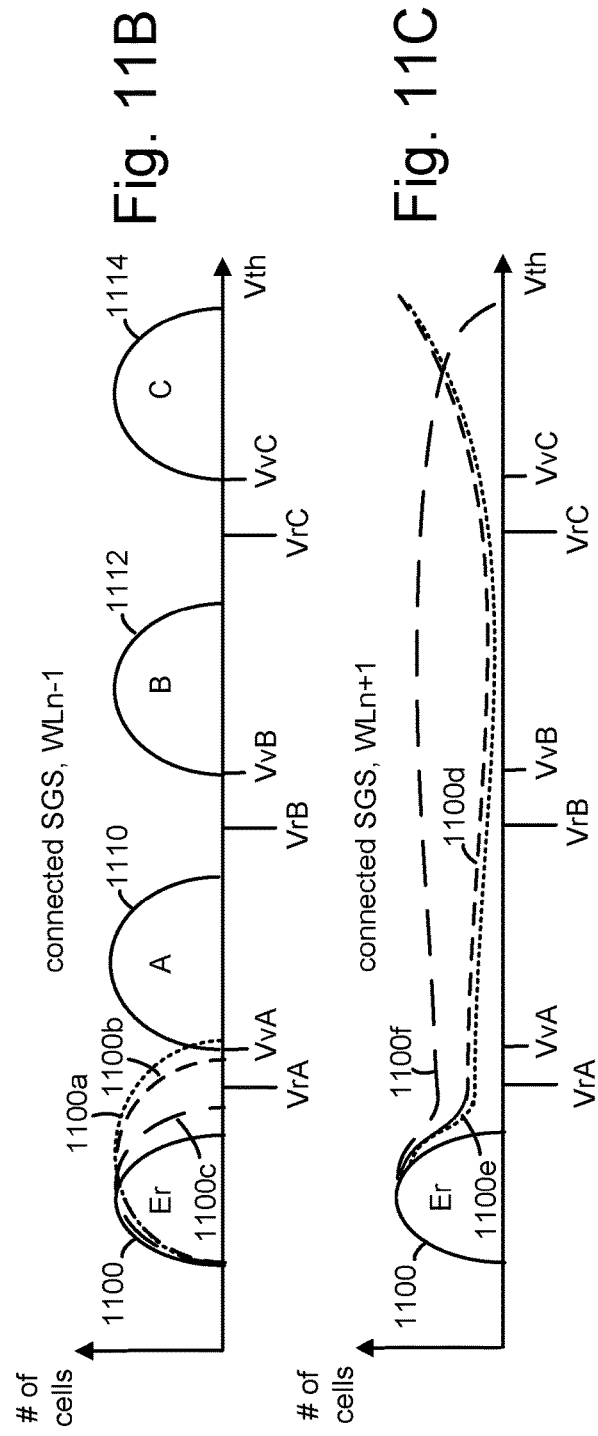

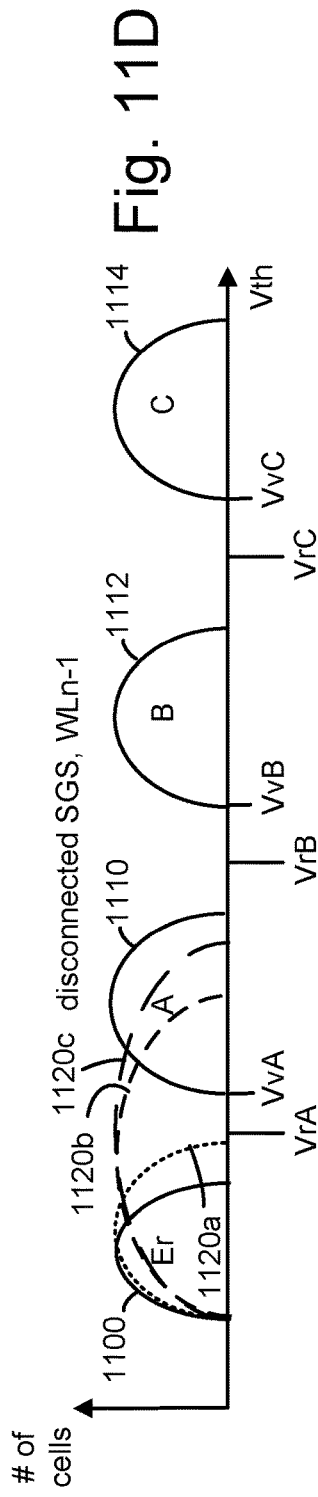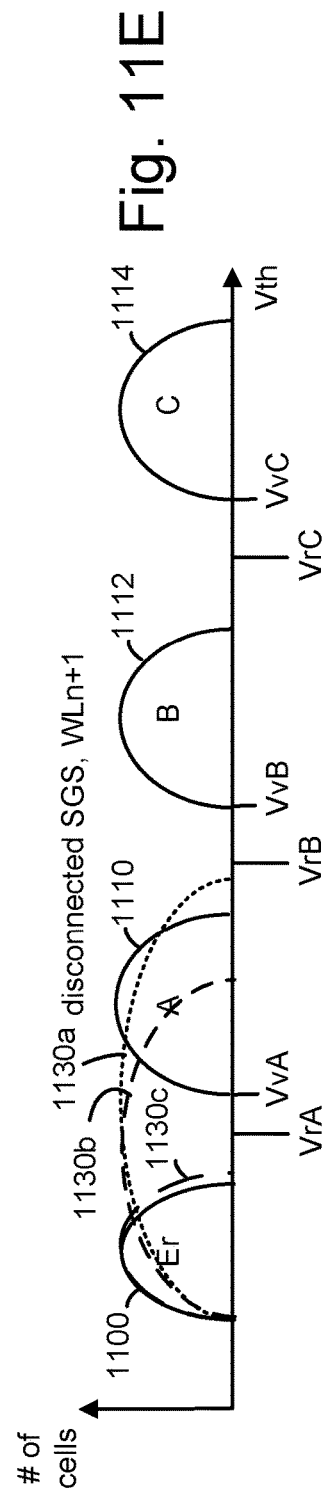

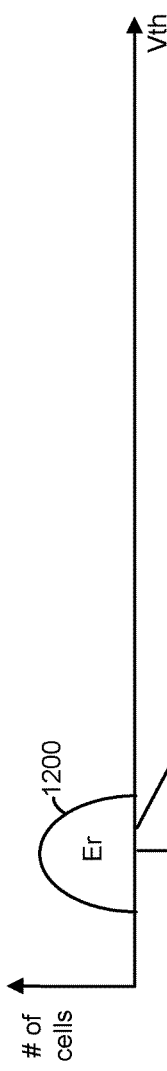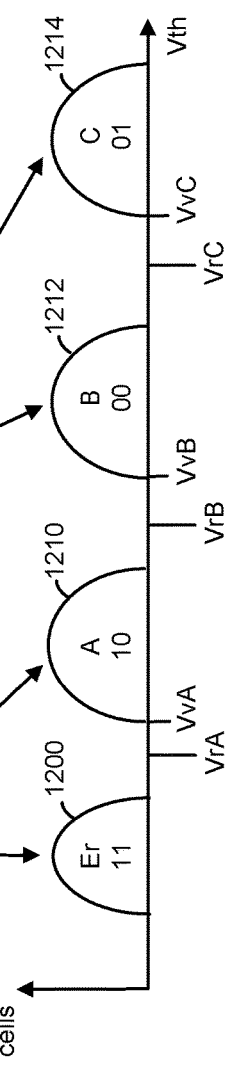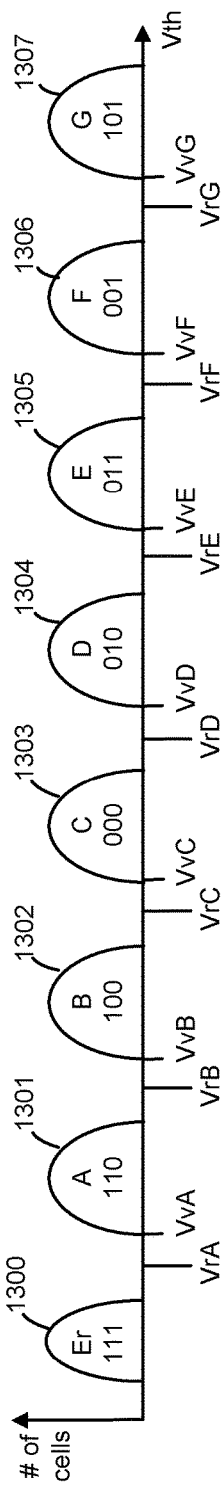

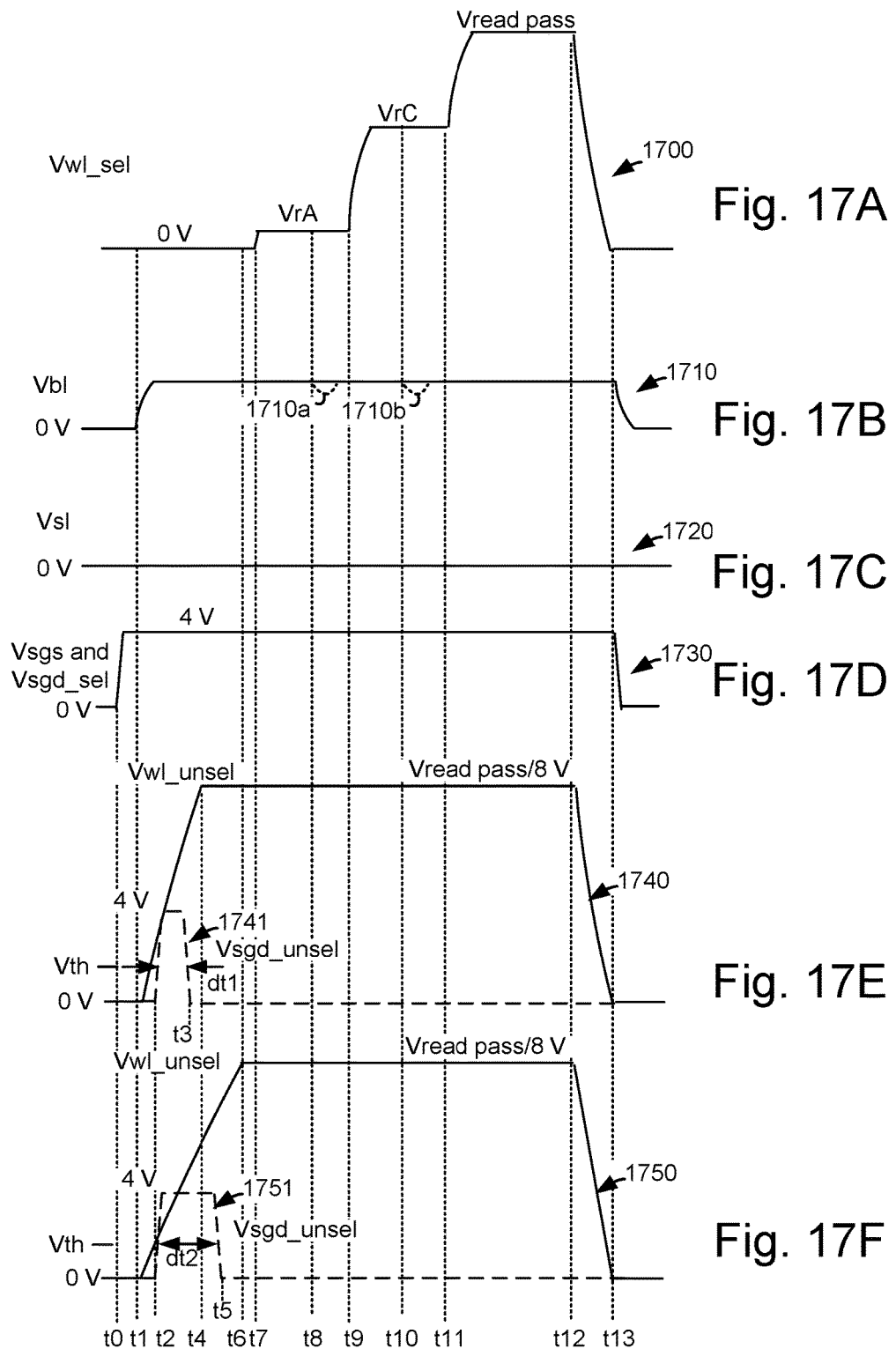

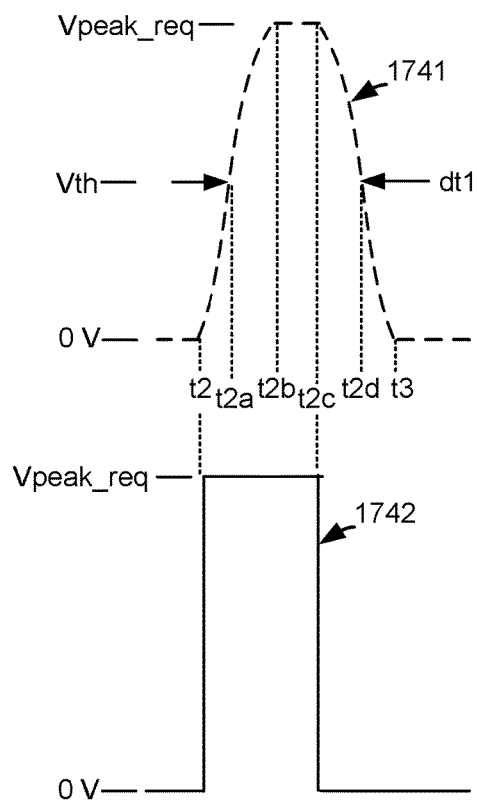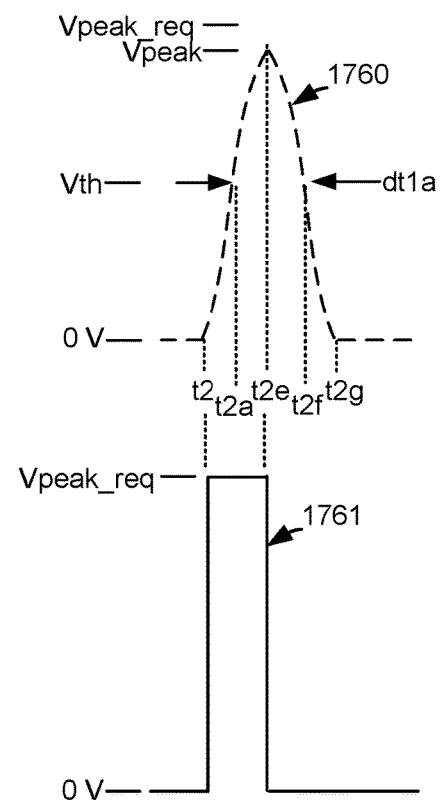

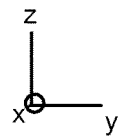
Fig. 19A
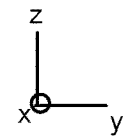
Fig. 19B
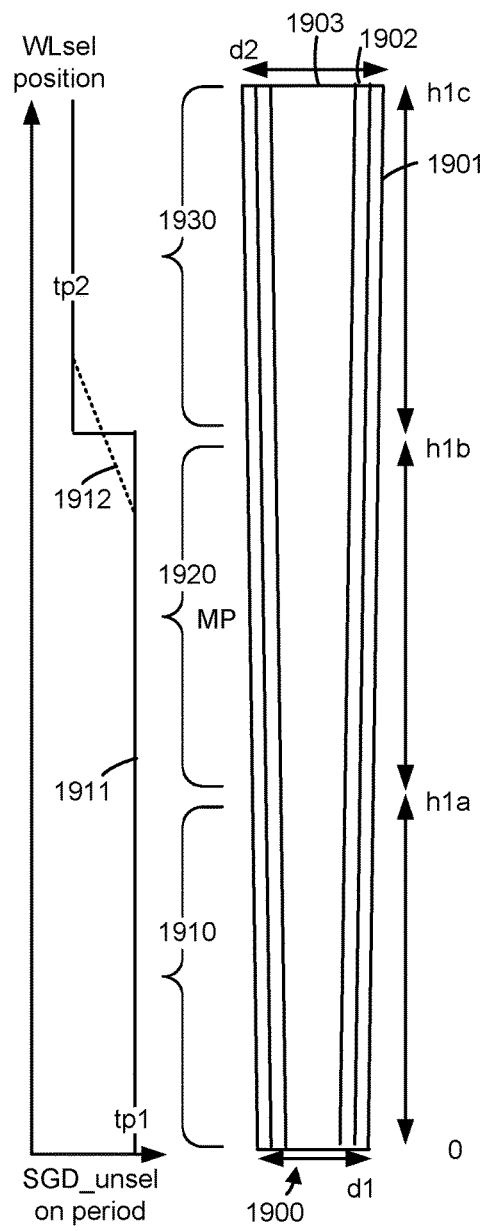
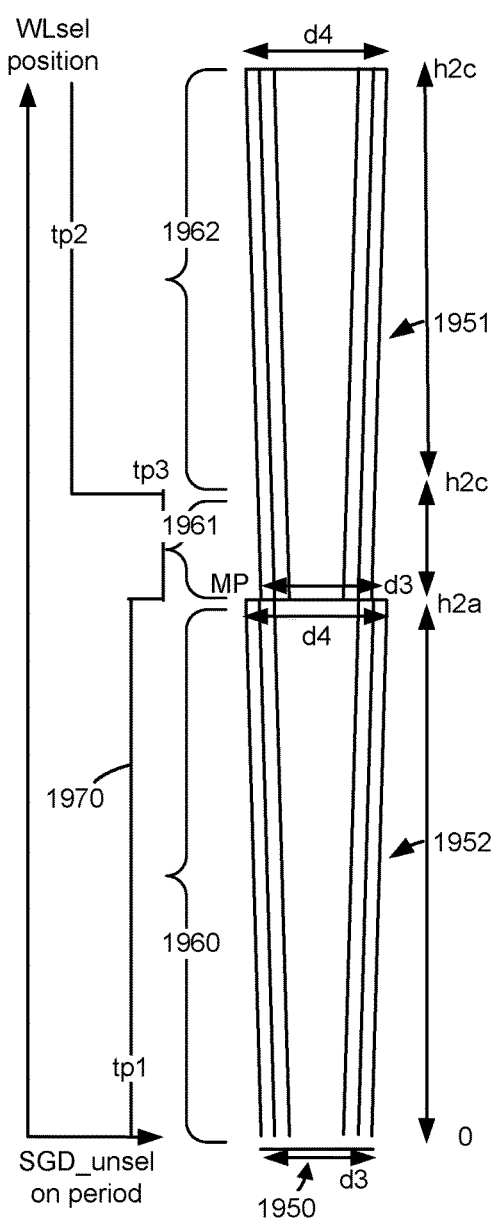

REDUCING HOT ELECTRON INJECTION TYPE OF READ DISTURB IN 3D MEMORY DEVICE HAVING CONNECTED SOURCE-END SELECT GATES

BACKGROUND

The present technology relates to the operation of memory devices.

Semiconductor memory devices have become more popular for use in various electronic devices. For example, non-volatile semiconductor memory is used in cellular telephones, digital cameras, personal digital assistants, mobile computing devices, non-mobile computing devices and other devices.

A charge-storing material such as a floating gate or a charge-trapping material can be used in such memory devices to store a charge which represents a data state. A charge-trapping material can be arranged vertically in a three-dimensional (3D) stacked memory structure, or horizontally in a two-dimensional (2D) memory structure. One example of a 3D memory structure is the Bit Cost Scalable (BiCS) architecture which comprises a stack of alternating conductive and dielectric layers.

A memory device includes memory cells which may be arranged in strings, for instance, where select gate transistors are provided at the ends of the string to selectively connect a channel of the string to a source line or bit line. However, various challenges are presented in operating such memory devices.

BRIEF DESCRIPTION OF THE DRAWINGS

FIG. 6A depicts an example cross-sectional view of a portion of one of the blocks of FIG. 5.

FIG. 6B depicts an example transistor 650.

FIG. 11A depicts an example threshold voltage (Vth) distribution of a set of memory cells connected to a selected word line WLn in a selected sub-block after a single-pass programming operation, where four data states are used.

FIG. 11B depicts an example Vth distribution of a set of memory cells connected to WLn−1 in an unselected sub-block showing the effects of read disturb, for the case of SGS transistors connected in a block, and for a source-end, midrange and a drain-end WLn.

FIG. 11C depicts an example Vth distribution of a set of memory cells connected to WLn+1 in an unselected sub-block showing the effects of read disturb, for the case of SGS transistors connected in a block, and for a source-end, midrange and a drain-end WLn.

FIG. 11D depicts an example Vth distribution of a set of memory cells connected to WLn−1 in an unselected sub-block showing the effects of read disturb, for the case of SGS transistors connected in a sub-block but not a block, and for a source-end, midrange and a drain-end WLn.

FIG. 11E depicts an example Vth distribution of a set of memory cells connected to WLn+1 in an unselected sub-block showing the effects of read disturb, for the case of SGS transistors connected in a sub-block but not a block, and for a source-end, midrange and a drain-end WLn.

FIG. 12A depicts an initial Vth distribution of memory cells in an example two-pass programming operation involving four data states.

FIG. 12B depicts a Vth distribution which results after a first pass of the example two-pass programming operation of FIG. 12A.

FIG. 12C depicts a Vth distribution which results after a second pass of the example two-pass programming operation of FIG. 12A.

FIG. 13 depicts an example Vth distribution of a set of memory cells connected to a selected word line after a programming operation, where eight data states are used.

FIG. 17A to 17E depicts example plots of voltages used in the sensing process of FIG. 14A.

FIG. 17A depicts an example plot 1700 of a voltage on a selected word line, Vwl_sel.

FIG. 17B depicts an example plot 1710 of a voltage on a bit line, Vbl.

FIG. 17C depicts an example plot 1720 of a voltage on a source line, Vsl.

FIG. 17D depicts an example plot 1730 of a voltage on connected SGS transistors in a block, Vsgs, and a voltage on SGD transistors of a selected sub-block, Vsgd_sel.

FIG. 17E depicts an example plot 1740 of a voltage on unselected word lines, Vwl_unsel, and an example plot 1741 of a voltage on SGD transistors of an unselected sub-block, Vsgd_unsel, consistent with step 1405a of FIG. 14A.

FIG. 17F depicts another example plot 1750 of Vwl_unsel, and an example plot 1751 of Vsgd_unsel, consistent with step 1405a of FIG. 14A, where the increase of Vwl_unsel occurs over a longer time period than in FIG. 17E, and the peak level of Vsgd_unsel occurs over a longer time period than in FIG. 17E.

FIG. 18A depicts a close up view of the plot 1741 of Vsgd_unsel in FIG. 17E and a plot 1742 of a control signal for a voltage driver, where Vsgd_unsel reaches a peak requested level of Vpeak_req.

FIG. 18B depicts an alternative case of a plot 1760 of Vsgd_unsel and a plot 1761 of a control signal for a voltage driver, where Vsgd_unsel does not reach a peak requested level of Vpeak_req.

FIG. 19A depicts a cross-sectional view of a pillar 1900 in which a memory string is provided, where the pillar tapers continuously from top to bottom, and a plot of an SGD_unsel on (conductive) period versus a selected word line position in the memory string, consistent with step 1405a of FIG. 14A.

FIG. 19B depicts a cross-sectional view of a pillar 1950 in which a memory string is provided, where the pillar tapers in two pillar portions 1951 and 1952, and a plot of an SGD_unsel on (conductive) period versus a selected word line position in the memory string, consistent with step 1405a of FIG. 14A.

DETAILED DESCRIPTION

Apparatuses and techniques are described for reducing read disturb in a memory device.

In some memory devices, memory cells are joined to one another such as in NAND strings in a block or sub-block. Each NAND string comprises a number of memory cells connected in series between one or more drain-end select gate (SG) transistors (referred to as SGD transistors), on a drain-end of the NAND string which is connected to a bit line, and one or more source-end SG transistors (referred to as SGS transistors), on a source-end of the NAND string or other memory string which is connected to a source line. Further, the memory cells can be arranged with a common control gate line (e.g., word line) which acts a control gate. A set of word lines extends from the source side of a block to the drain side of a block. Memory cells can be connected in other types of strings and in other ways as well.

In a 3D memory structure, the memory cells may be arranged in vertical memory strings in a stack, where the stack comprises alternating conductive and dielectric layers. The conductive layers act as word lines which are connected to the memory cells. Each memory string may have the shape of a pillar which intersects with the word lines to form the memory cells.

The memory cells can include data memory cells, which are eligible to store user data, and dummy or non-data memory cells which are ineligible to store user data. A dummy word line is connected to a dummy memory cell. One or more dummy memory cells may be provided at the drain and/or source ends of a string of memory cells to provide a gradual transition in the channel voltage gradient.

Figure 15:
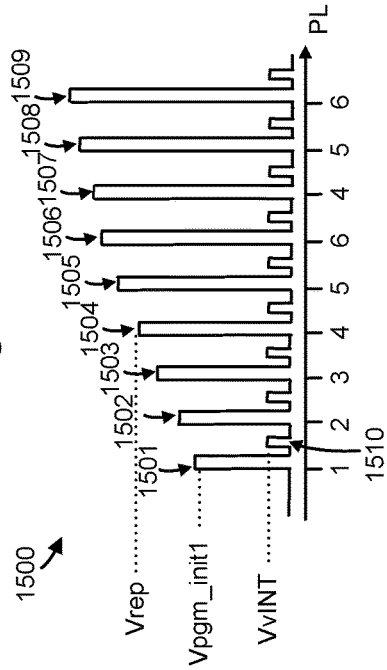
FIG. 15 depicts a series of program loops in an example of a programming pass for a lower page of data, consistent with FIG. 14D.
Figure 16:
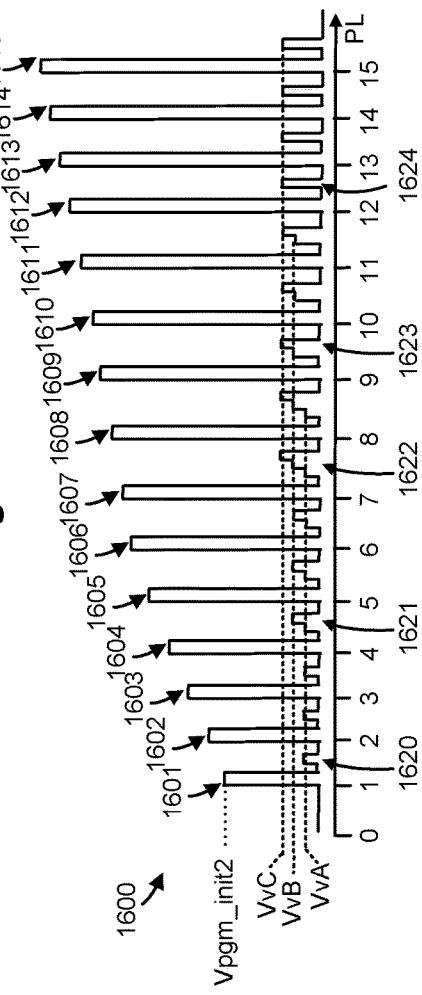
FIG. 16 depicts a series of program loops in an example of a programming pass for an upper page of data, consistent with FIGS. 14D and 15.

During a programming operation, the memory cells are programmed according to a word line programming order. For example, the programming may start at the word line at the source side of the block and proceed to the word line at the drain side of the block. In one approach, each word line is completely programmed before programming a next word line. For example, a first word line, WL0, is programmed using one or more programming passes until the programming is completed. Next, a second word line, WL1, is programmed using one or more programming passes until the programming is completed, and so forth. A programming pass may include a set of increasing program voltages which are applied to the word line in respective program loops or program-verify iterations, such as depicted in FIGS. 15 and 16. Verify operations may be performed after each program voltage to determine whether the memory cells have completed programming. When programming is completed for a memory cell, it can be locked out from further programming while programming continues for other memory cells in subsequent program loops.

The memory cells may also be programmed according to a sub-block programming order, where memory cells in one sub-block, or portion of a block, are programmed before programming memory cells in another sub-block.

Each memory cell may be associated with a data state according to write data in a program command. Based on its data state, a memory cell will either remain in the erased state or be programmed to a programmed data state. For example, in a one bit per cell memory device, there are two data states including the erased state and the programmed state. In a two-bit per cell memory device, there are four data states including the erased state and three higher data states referred to as the A, B and C data states (see FIG. 11A). In a three-bit per cell memory device, there are eight data states including the erased state and seven higher data states referred to as the A, B, C, D, E, F and G data states (see FIG. 13). In a four-bit per cell memory device, there are sixteen data states including the erased state and fifteen higher data states. The data states may be referred to as the S0-S15 data states where S0 is the erased state.

After the memory cells are programmed, the data can be read back in a read operation. A read operation can involve applying a series of read voltages to a word line while sensing circuitry determines whether cells connected to the word line are in a conductive or non-conductive state. If a cell is in a non-conductive state, the Vth of the memory cell exceeds the read voltage. The read voltages are set at levels which are expected to be between the threshold voltage levels of adjacent data states. During the read operation, the voltages of the unselected word lines are ramped up to a read pass level which is high enough to place the unselected memory cells in a strongly conductive state, to avoid interfering with the sensing of the selected memory cells.

However, the Vth of the memory cells, especially the erased state cells, can be increased by read disturb. One type of read disturb is caused by weak Fowler-Nordheim (F-N) tunneling due to a large voltage difference between the control gate and a channel of a cell. One countermeasure is to boost the channel voltages of the memory strings. Another type of read disturb is hot electron injection (HEI) type of read disturb. In this case, a channel gradient generates electron-hole pairs in which electrons can be injected into the charge trapping layer of a memory cell, increasing its Vth. The boosting of the channel can sometimes increase the likelihood of the injection type of disturb.

The likelihood of the injection type of disturb is also a function of the architecture of the memory device. In particular, when the SGS transistors in the different sub-blocks are connected to one another, the ability to control the SGS transistor differently in the selected and unselected sub-blocks is lost. Instead, all of the SGS transistors are conductive during a sensing operation. This architecture can simply the fabrication process, and reduce the circuitry for driving the SGS transistors in the different sub-blocks separately, but results in very significant, unacceptable levels of read disturb in the unselected sub-blocks.

Techniques provided herein address the above and other issues. In one aspect, the SGD transistors of the unselected sub-blocks are made temporarily conductive during the ramp up of the unselected word line voltages to reduce the amount of capacitive coupling up of the respective memory string channel. This reduces a channel gradient which can exist in the memory string channels, thereby also reducing the injection type of disturb. Further, the time period in which the SGD transistors are made temporarily conductive is a function of the selected word line position, where the time period is greater when the selected word line is in a source-end or midrange subset of the word lines than when the selected word line is in a drain-end subset of the word lines. Further, the technique can be applied during a sensing process which occurs in a read operation or a verify test in a programming operation.

Another option involves omitting the injection disturb countermeasure, or reducing the severity of the injection disturb countermeasure, when the unselected sub-blocks have not been programmed since the likelihood of the injection type of disturb is significantly reduced in this situation.

Another option applies the injection disturb countermeasure to a memory pillar which has a local minimum in its width midway or otherwise partway between the top and bottom of the pillar. Due to a stronger electric field at this location, the time period in which the SGD transistors are made temporarily conductive can be increased. For example, the time period can be higher when the selected word line is among a subset of word lines which encompasses the local minimum than when the selected word line is in a source-end subset. The smallest time period is when the selected word line is in a drain-end subset.

These and other features are discussed further below.

Figure 1:
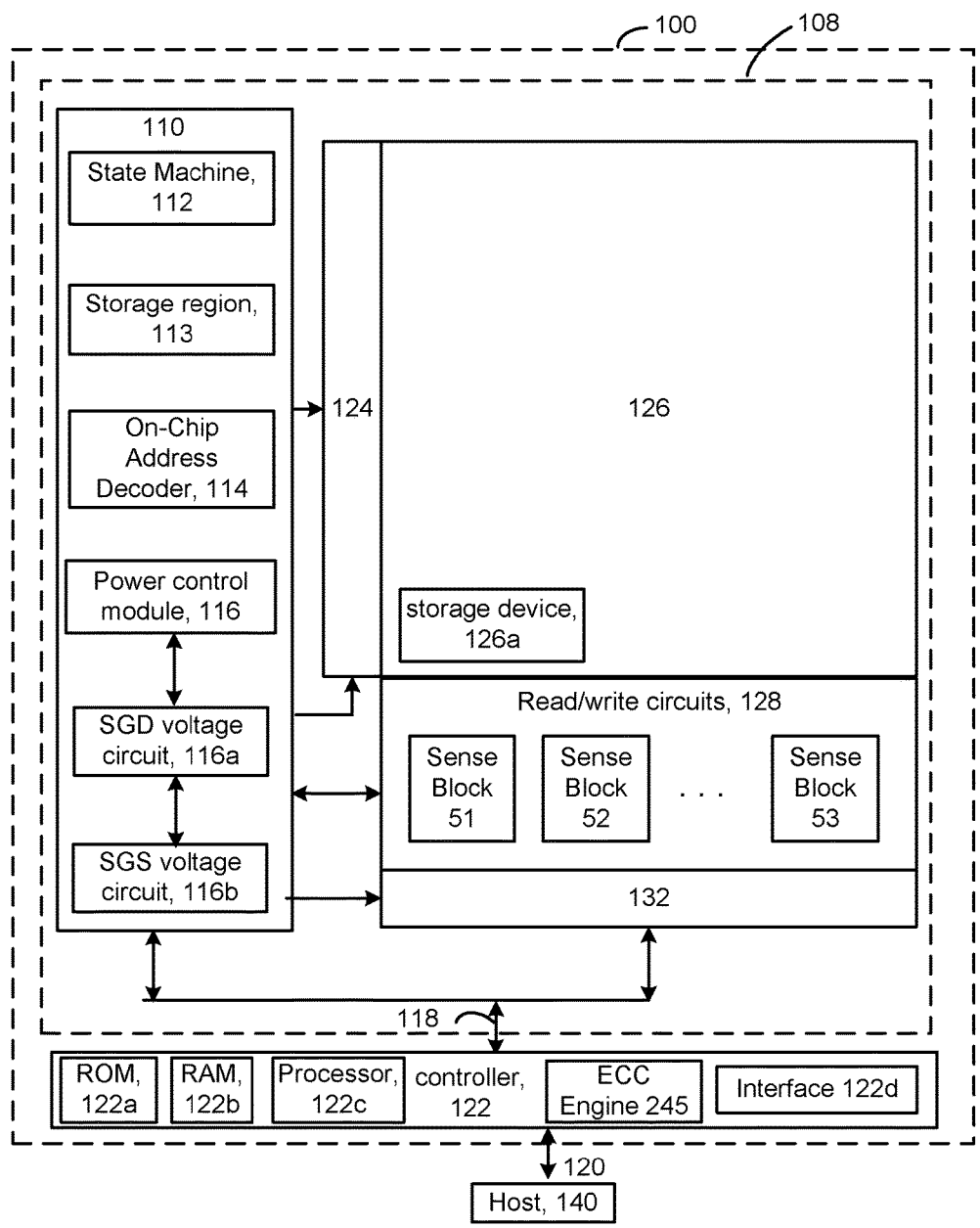
FIG. 1 is a block diagram of an example memory device.

FIG. 1 is a block diagram of an example memory device. The memory device 100, such as a non-volatile storage system, may include one or more memory die 108. The memory die 108 includes a memory structure 126 of memory cells, such as an array of memory cells, control circuitry 110, and read/write circuits 128. The memory structure 126 is addressable by word lines via a row decoder 124 and by bit lines via a column decoder 132. The read/write circuits 128 include multiple sense blocks 51, 52, . . . ,53 (sensing circuitry) and allow a page of memory cells to be read or programmed in parallel. Typically a controller 122 is included in the same memory device 100 (e.g., a removable storage card) as the one or more memory die 108. The controller may be separate from the memory die. Commands and data are transferred between the host 140 and controller 122 via a data bus 120, and between the controller and the one or more memory die 108 via lines 118.

The memory structure can be 2D or 3D. The memory structure may comprise one or more array of memory cells including a 3D array. The memory structure may comprise a monolithic 3D memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

The control circuitry 110 cooperates with the read/write circuits 128 to perform memory operations on the memory structure 126, and includes a state machine 112, an on-chip address decoder 114, and a power control module 116 which includes a SGD transistor voltage circuit 116a and an SGS transistor voltage circuit 116b. The circuits 116a and 116b may be used to set voltages during a sensing process to reduce read disturb as described herein. The state machine 112 provides chip-level control of memory operations. A storage region 113 may be provided, e.g., for operational parameters and software/code. In one embodiment, the state machine is programmable by the software. In other embodiments, the state machine does not use software and is completely implemented in hardware (e.g., electrical circuits).

The on-chip address decoder 114 provides an address interface between that used by the host or a memory controller to the hardware address used by the decoders 124 and 132. The power control module 116 controls the power and voltages supplied to the word lines, select gate lines, bit lines and source lines during memory operations. It can include drivers for word lines, SGS and SGD transistors and source lines. The sense blocks can include bit line drivers, in one approach. An SGS transistor is a select gate transistor at a source end of a NAND string, and an SGD transistor is a select gate transistor at a drain end of a NAND string.

In some implementations, some of the components can be combined. In various designs, one or more of the components (alone or in combination), other than memory structure 126, can be thought of as at least one control circuit which is configured to perform the techniques described herein including the steps of the processes described herein. For example, a control circuit may include any one of, or a combination of, control circuitry 110, state machine 112, decoders 114 and 132, power control module 116, sense blocks 51, 52, . . . , 53, read/write circuits 128, controller 122, and so forth.

The off-chip controller 122 (which in one embodiment is an electrical circuit) may comprise a processor 122c, storage devices (memory) such as ROM 122a and RAM 122b and an error-correction code (ECC) engine 245. The ECC engine can correct a number of read errors.

A memory interface 122d may also be provided. The memory interface, in communication with ROM, RAM and processor, is an electrical circuit that provides an electrical interface between controller and memory die. For example, the memory interface can change the format or timing of signals, provide a buffer, isolate from surges, latch I/O and so forth. The processor can issue commands to the control circuitry 110 (or any other component of the memory die) via the memory interface 122d.

The storage device comprises code such as a set of instructions, and the processor is operable to execute the set of instructions to provide the functionality described herein. Alternatively or additionally, the processor can access code from a storage device 126a of the memory structure, such as a reserved area of memory cells in one or more word lines.

For example, code can be used by the controller to access the memory structure such as for programming, read and erase operations. The code can include boot code and control code (e.g., a set of instructions). The boot code is software that initializes the controller during a booting or startup process and enables the controller to access the memory structure. The code can be used by the controller to control one or more memory structures. Upon being powered up, the processor 122c fetches the boot code from the ROM 122a or storage device 126a for execution, and the boot code initializes the system components and loads the control code into the RAM 122b. Once the control code is loaded into the RAM, it is executed by the processor. The control code includes drivers to perform basic tasks such as controlling and allocating memory, prioritizing the processing of instructions, and controlling input and output ports.

Generally, the control code can include instructions to perform the functions described herein including the steps of the flowcharts discussed further below, and provide the voltage waveforms including those discussed further below. A control circuit can be configured to execute the instructions to perform the functions described herein.

In one embodiment, the host is a computing device (e.g., laptop, desktop, smartphone, tablet, digital camera) that includes one or more processors, one or more processor readable storage devices (RAM, ROM, flash memory, hard disk drive, solid state memory) that store processor readable code (e.g., software) for programming the one or more processors to perform the methods described herein. The host may also include additional system memory, one or more input/output interfaces and/or one or more input/output devices in communication with the one or more processors.

Other types of non-volatile memory in addition to NAND flash memory can also be used.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and SG transistors.

A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured.

The semiconductor memory elements located within and/or over a substrate may be arranged in two or three dimensions, such as a 2D memory structure or a 3D memory structure.

In a 2D memory structure, the semiconductor memory elements are arranged in a single plane or a single memory device level. Typically, in a 2D memory structure, memory elements are arranged in a plane (e.g., in an x-y direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A 3D memory array is arranged so that memory elements occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a 3D memory structure may be vertically arranged as a stack of multiple 2D memory device levels. As another non-limiting example, a 3D memory array may be arranged as multiple vertical columns (e.g., columns extending substantially perpendicular to the major surface of the substrate, i.e., in the y direction) with each column having multiple memory elements. The columns may be arranged in a 2D configuration, e.g., in an x-y plane, resulting in a 3D arrangement of memory elements with elements on multiple vertically stacked memory planes. Other configurations of memory elements in three dimensions can also constitute a 3D memory array.

By way of non-limiting example, in a 3D NAND memory array, the memory elements may be coupled together to form a NAND string within a single horizontal (e.g., x-y) memory device level. Alternatively, the memory elements may be coupled together to form a vertical NAND string that traverses across multiple horizontal memory device levels. Other 3D configurations can be envisioned wherein some NAND strings contain memory elements in a single memory level while other strings contain memory elements which span through multiple memory levels. 3D memory arrays may also be designed in a NOR configuration and in a ReRAM configuration.

Typically, in a monolithic 3D memory array, one or more memory device levels are formed above a single substrate. Optionally, the monolithic 3D memory array may also have one or more memory layers at least partially within the single substrate. As a non-limiting example, the substrate may include a semiconductor such as silicon. In a monolithic 3D array, the layers constituting each memory device level of the array are typically formed on the layers of the underlying memory device levels of the array. However, layers of adjacent memory device levels of a monolithic 3D memory array may be shared or have intervening layers between memory device levels.

2D arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic 3D memory arrays. Further, multiple 2D memory arrays or 3D memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this technology is not limited to the 2D and 3D exemplary structures described but covers all relevant memory structures within the spirit and scope of the technology as described herein and as understood by one of skill in the art.

Figure 2:
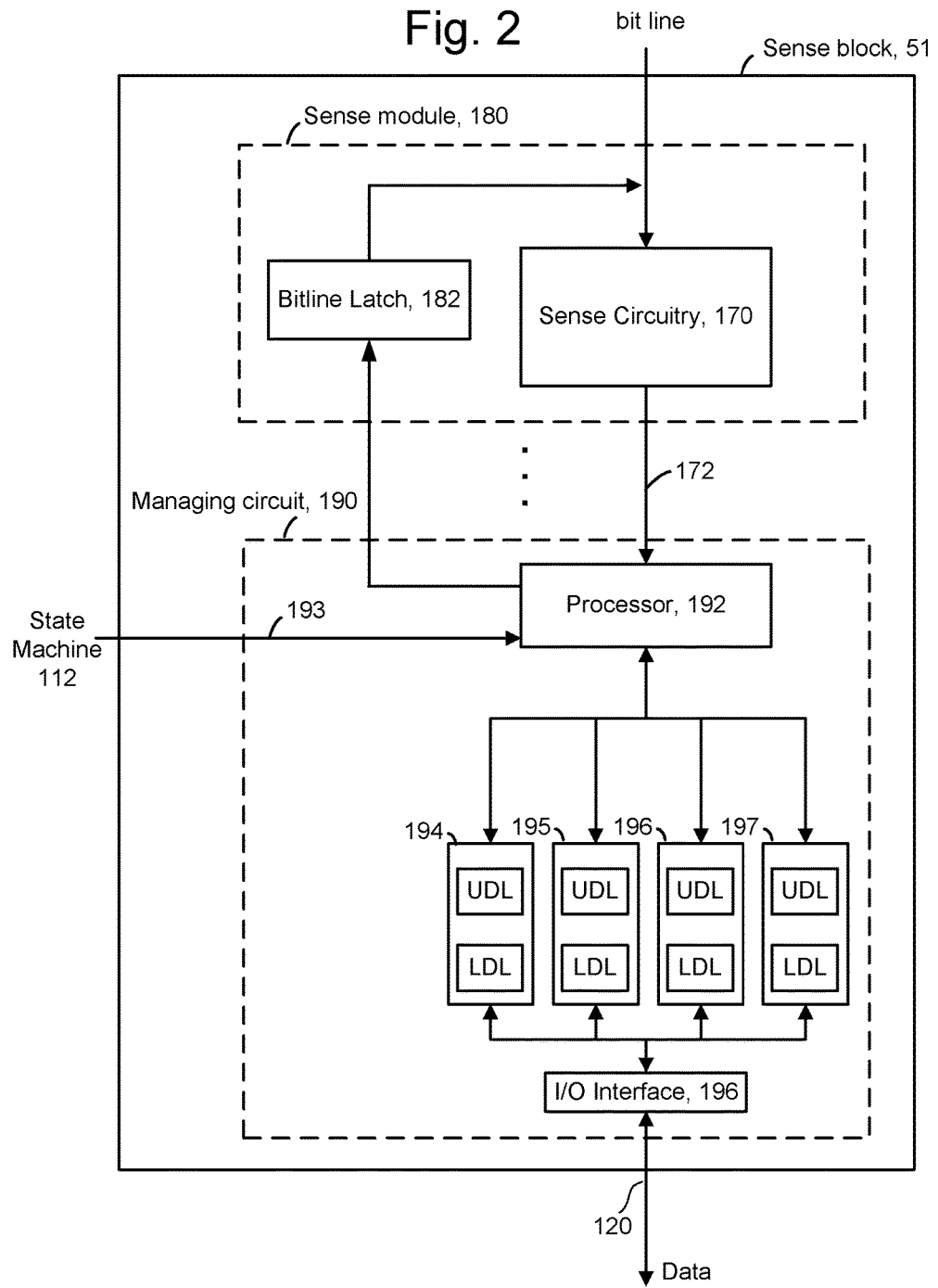
FIG. 2 is a block diagram depicting one embodiment of a sense block 51-53 of FIG. 1.

FIG. 2 is a block diagram depicting one embodiment of a sense block 51-53 of FIG. 1. An individual sense block 51 is partitioned into one or more core portions, referred to as sense modules 180 or sense amplifiers, and a common portion, referred to as a managing circuit 190. In one embodiment, there will be a separate sense module 180 for each bit line and one common managing circuit 190 for a set of multiple, e.g., four or eight, sense modules 180. Each of the sense modules in a group communicates with the associated managing circuit via data bus 172. Thus, there are one or more managing circuits which communicate with the sense modules of a set of storage elements.

Sense module 180 comprises sense circuitry 170 that performs sensing by determining whether a conduction current in a connected bit line is above or below a predetermined threshold level. Sense module 180 also includes a bit line latch 182 that is used to set a voltage condition on the connected bit line. For example, a predetermined state latched in bit line latch 182 will result in the connected bit line being pulled to a state designating program inhibit (e.g., 1.5-3 V). As an example, a flag=0 can inhibit programming, while flag=1 does not inhibit programming.

Managing circuit 190 comprises a processor 192, four example sets of data latches 194-197 and an I/O Interface 196 coupled between the set of data latches 194 and data bus 120. One set of data latches can be provide for each sense module, and data latches identified by LDL and UDL may be provided for each set. In some cases, additional data latches may be used. LDL stores a bit for a lower page of data, and UDL stores a bit for an upper page of data. This is in a four-level or two-bits per storage element memory device. One additional data latch per bit line can be provided for each additional data bit per storage element.

Processor 192 performs computations, such as to determine the data stored in the sensed storage element and store the determined data in the set of data latches. Each set of data latches 194-197 is used to store data bits determined by processor 192 during a read operation, and to store data bits imported from the data bus 120 during a programming operation which represent write data meant to be programmed into the memory. I/O interface 196 provides an interface between data latches 194-197 and the data bus 120.

During reading, the operation of the system is under the control of state machine 112 that controls the supply of different control gate voltages to the addressed storage element. As it steps through the various predefined control gate voltages corresponding to the various memory states supported by the memory, the sense module 180 may trip at one of these voltages and a corresponding output will be provided from sense module 180 to processor 192 via bus 172. At that point, processor 192 determines the resultant memory state by consideration of the tripping event(s) of the sense module and the information about the applied control gate voltage from the state machine via input lines 193. It then computes a binary encoding for the memory state and stores the resultant data bits into data latches 194-197. In another embodiment of the managing circuit 190, bit line latch 182 serves double duty, both as a latch for latching the output of the sense module 180 and also as a bit line latch as described above.

Some implementations can include multiple processors 192. In one embodiment, each processor 192 will include an output line (not depicted) such that each of the output lines is wired-OR'd together. In some embodiments, the output lines are inverted prior to being connected to the wired-OR line. This configuration enables a quick determination during the program verification process of when the programming process has completed because the state machine receiving the wired-OR can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. Because each processor communicates with eight sense modules, the state machine needs to read the wired-OR line eight times, or logic is added to processor 192 to accumulate the results of the associated bit lines such that the state machine need only read the wired-OR line one time. Similarly, by choosing the logic levels correctly, the global state machine can detect when the first bit changes its state and change the algorithms accordingly.

During program or verify operations, the data to be programmed (write data) is stored in the set of data latches 194-197 from the data bus 120, in the LDL and UDL latches, in a two-bit per storage element implementation. In a three-bit per storage element implementation, an additional data latch may be used. The programming operation, under the control of the state machine, comprises a series of programming voltage pulses applied to the control gates of the addressed storage elements. Each program pulse is followed by a read back (verify) to determine if the storage element has been programmed to the desired memory state. In some cases, processor 192 monitors the read back memory state relative to the desired memory state. When the two are in agreement, the processor 192 sets the bit line latch 182 so as to cause the bit line to be pulled to a state designating program inhibit. This inhibits the storage element coupled to the bit line from further programming even if program pulses appear on its control gate. In other embodiments the processor initially loads the bit line latch 182 and the sense circuitry sets it to an inhibit value during the verify process.

Each set of data latches 194-197 may be implemented as a stack of data latches for each sense module. In one embodiment, there are three data latches per sense module 180. In some implementations, the data latches are implemented as a shift register so that the parallel data stored therein is converted to serial data for data bus 120, and vice versa. All the data latches corresponding to the read/write block of storage elements can be linked together to form a block shift register so that a block of data can be input or output by serial transfer. In particular, the bank of read/write modules is adapted so that each of its set of data latches will shift data in to or out of the data bus in sequence as if they are part of a shift register for the entire read/write block.

The data latches identify when an associated storage element has reached certain mileposts in a programming operations. For example, latches may identify that a storage element's Vth is below a particular verify level. The data latches indicate whether a storage element currently stores one or more bits from a page of data. For example, the LDL latches can be used to store a lower page of data. An LDL latch is flipped (e.g., from 0 to 1) when a lower page bit is stored in an associated storage element. A UDL latch is flipped when an upper page bit is stored in an associated storage element. This occurs when an associated storage element completes programming, e.g., when its Vth exceeds a target verify level such as VvA, VvB or VvC.

Figure 3:
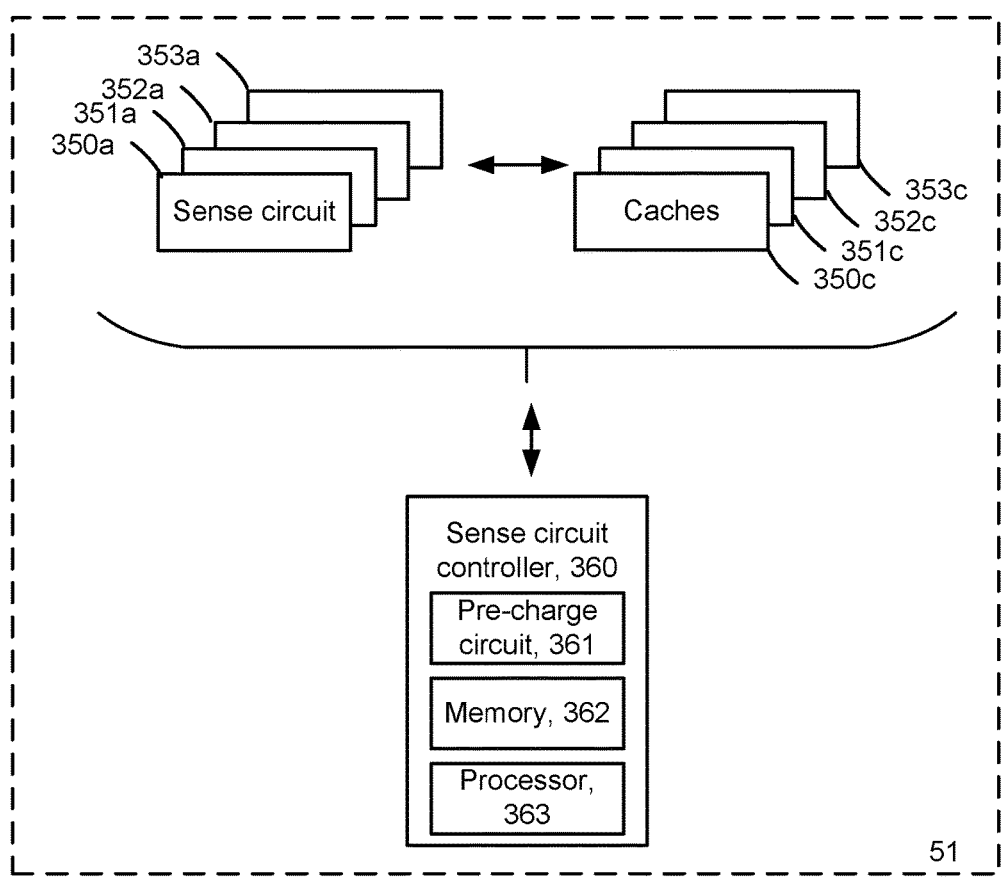
FIG. 3 depicts an example block diagram of a sense block 51 in the column control circuitry of FIG. 1.

FIG. 3 depicts an example block diagram of a sense block 51 in the column control circuitry of FIG. 1. The column control circuitry can include multiple sense blocks, where each sense block performs sensing, e.g., read, program verify or erase verify operations for multiple memory cells via respective bit lines.

In one approach, a sense block comprises multiple sense circuits, also referred to as sense amplifiers. Each sense circuit is associated with data latches and caches. For example, the example sense circuits 350a, 351a, 352a and 353a are associated with caches 350c, 351c, 352c and 353c, respectively.

In one approach, different subsets of bit lines can be sensed using different respective sense blocks. This allows the processing load which is associated with the sense circuits to be divided up and handled by a respective processor in each sense block. For example, a sense circuit controller 360 can communicate with the set, e.g., sixteen, of sense circuits and latches. The sense circuit controller may include a pre-charge circuit 361 which provides a voltage to each sense circuit for setting a pre-charge voltage. The sense circuit controller may also include a memory 362 and a processor 363.

Further example details of the sense circuit controller and the sense circuits are provided below.

Figure 4:
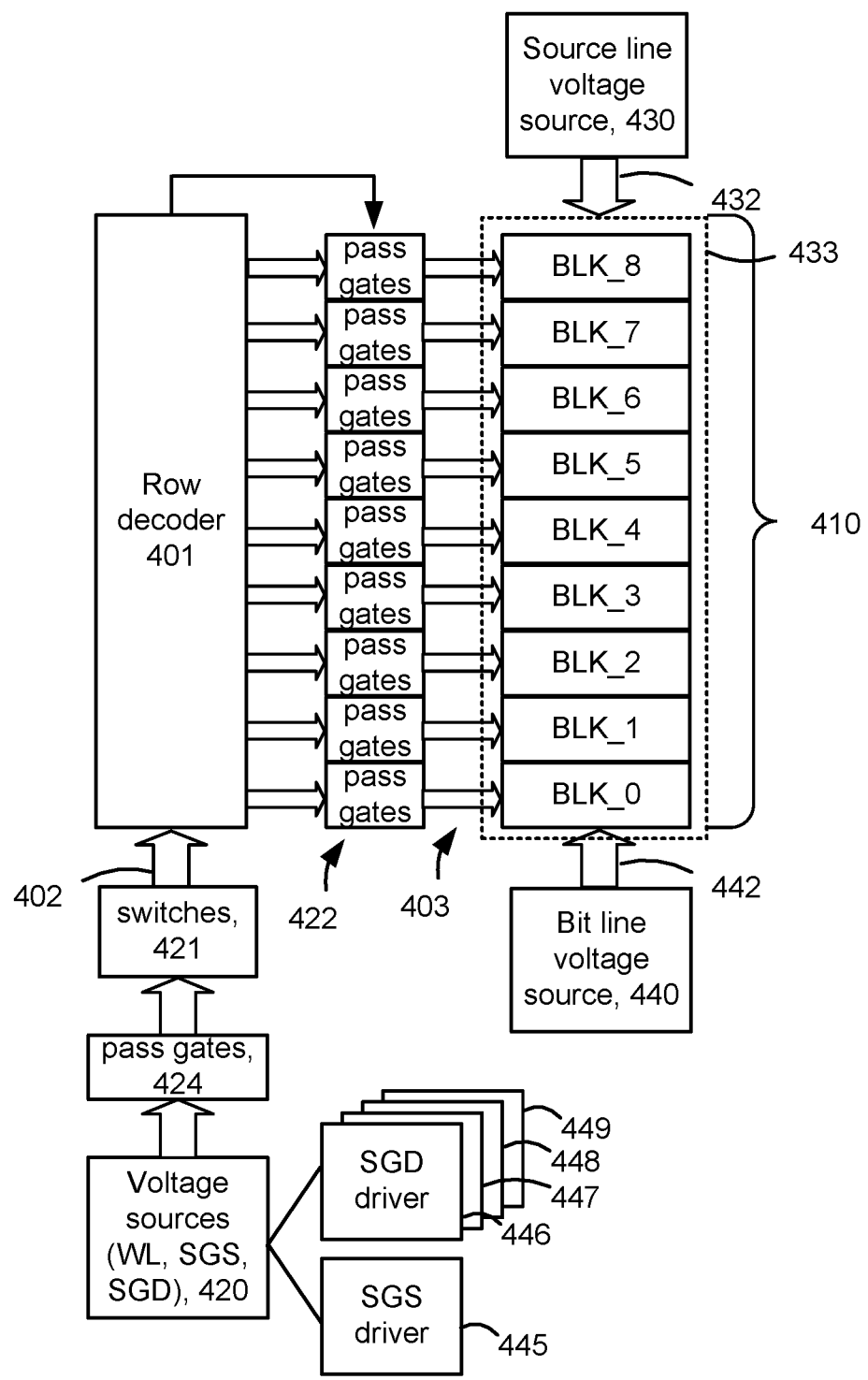
FIG. 4 depicts an example circuit for providing voltages to blocks of memory cells.

FIG. 4 depicts an example circuit for providing voltages to blocks of memory cells. In this example, a row decoder 401 provides voltages to word lines and select gates of each block in set of blocks 410. The set could be in a plane and includes blocks BLK_0 to BLK_8. The row decoder provides a control signal to pass gates 422 which connect the blocks to the row decoder. Typically, operations, e.g., program, read or erase, are performed on one selected block at a time. The row decoder can connect global control lines 402 to local control lines 403. The control lines represent conductive paths. Voltages are provided on the global control lines from voltage sources 420. The voltage sources may provide voltages to switches 421 which connect to the global control lines. Pass gates 424, also referred to as pass transistors or transfer transistors, are controlled to pass voltages from the voltage sources 420 to the switches 421.

The voltage sources 420 can provide voltages on word lines (WL), SGS control gates and SGD control gates, for example. Specifically, the voltage sources 420 can include, for each block, a SGS driver 445, and separate SGD drivers for each sub-block. For example, SGD drivers 446, 447, 448 and 449 can be provided for SB0, SB1, SB2 and SB3, respectively, in FIGS. 7 and 8.

The various components, including the row decoder, may receive commands from a controller such as the state machine 112 or the controller 122 to perform the functions described herein.

A source line voltage source 430 provides the voltage Vsl to the source lines/diffusion region in the substrate via control lines 432. In one approach, the source diffusion region 433 is common to the blocks. A set of bit lines 442 is also shared by the blocks. A bit line voltage source 440 provides voltages to the bit lines. In one possible implementation, the voltage sources 420 are near the bit line voltage source.

Figure 5:
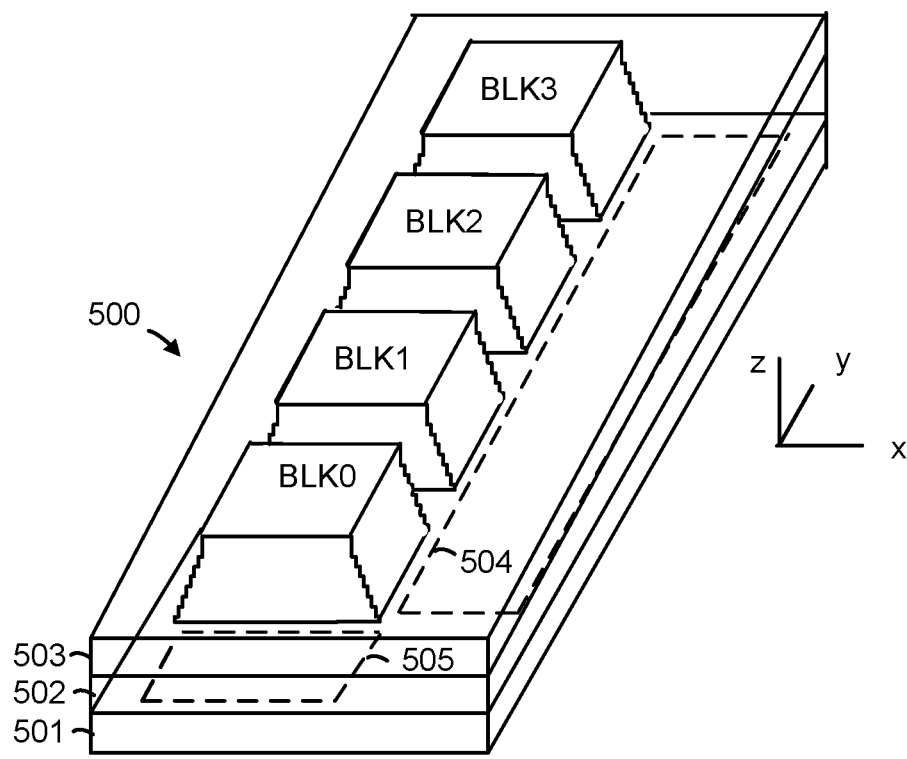
FIG. 5 is a perspective view of a memory device 500 comprising a set of blocks in an example 3D configuration of the memory structure 126 of FIG. 1.

FIG. 5 is a perspective view of a memory device 500 comprising a set of blocks in an example 3D configuration of the memory structure 126 of FIG. 1. On the substrate are example blocks BLK0, BLK1, BLK2 and BLK3 of memory cells (storage elements) and peripheral areas with circuitry for use by the blocks. The peripheral area 504 runs along an edge of each block while the peripheral area 505 is at an end of the set of blocks. The pass gates for a voltage source of the SGS transistors may be located in this peripheral area 505, in one approach. In this case, the blocks BLK0, BLK1, BLK2 and BLK3 are at progressively further distances from the pass gates. The circuitry can include voltage drivers which can be connected to control gate layers, bit lines and source lines of the blocks. In one approach, control gate layers at a common height in the blocks are commonly driven. The substrate 501 can also carry circuitry under the blocks, and one or more lower metal layers which are patterned in conductive paths to carry signals of the circuitry. The blocks are formed in an intermediate region 502 of the memory device. In an upper region 503 of the memory device, one or more upper metal layers are patterned in conductive paths to carry signals of the circuitry. Each block comprises a stacked area of memory cells, where alternating levels of the stack represent word lines. In one possible approach, each block has opposing tiered sides from which vertical contacts extend upward to an upper metal layer to form connections to conductive paths. While four blocks are depicted as an example, two or more blocks can be used, extending in the x- and/or y-directions.

In one possible approach, the blocks are in a plane, and the length of the plane, in the x-direction, represents a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device. The blocks could also be arranged in multiple planes.

Figure 6C:
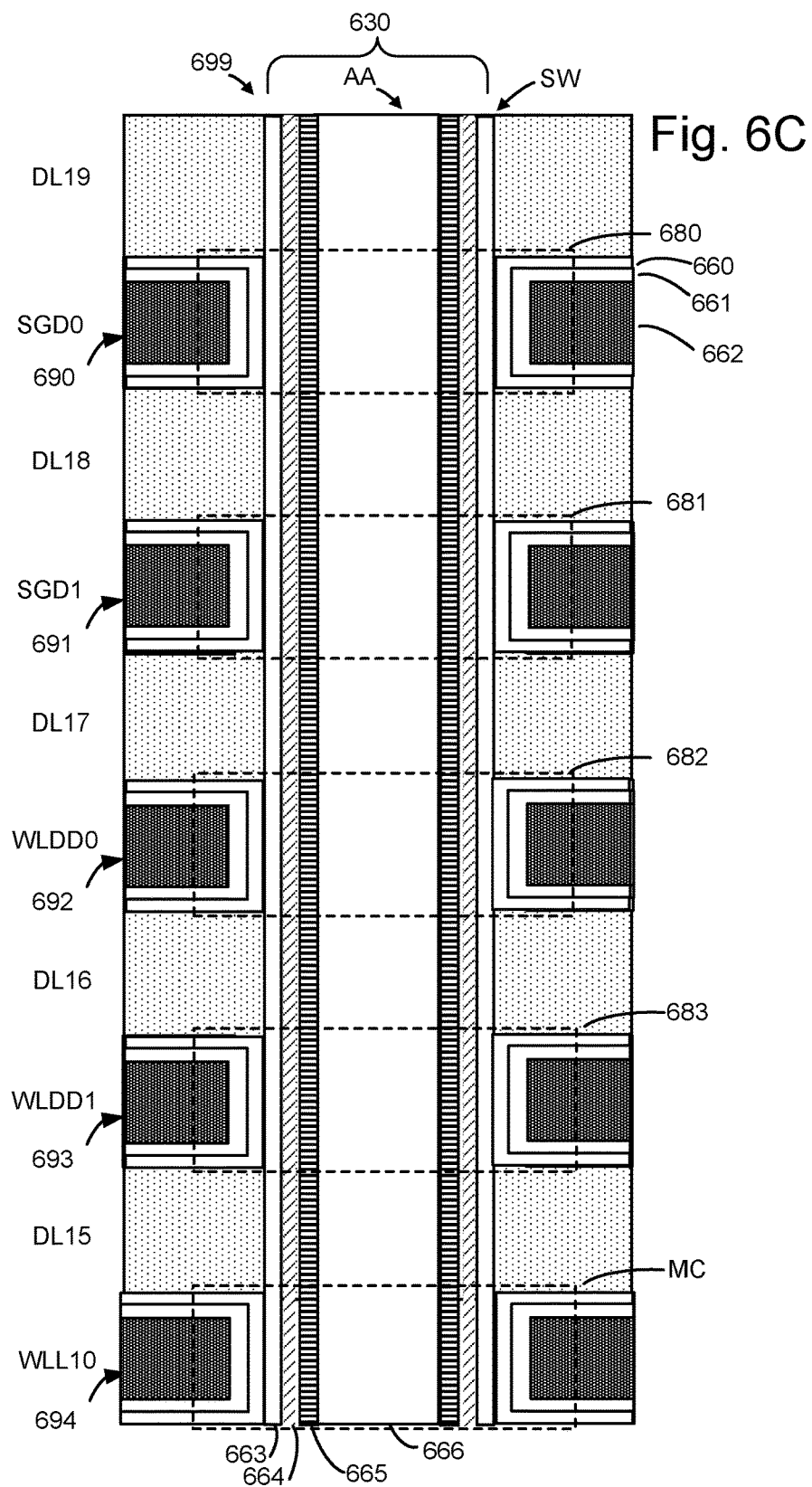
FIG. 6C depicts a close-up view of the region 622 of the stack of FIG. 6A.

FIG. 6A depicts an example cross-sectional view of a portion of one of the blocks of FIG. 5. The block comprises a stack 610 of alternating conductive and dielectric layers. In this example, the conductive layers comprise two SGD layers, one SGS layer, two source side dummy word line layers (or word lines) WLDS1 and WLDS0, two drain side dummy word line layers WLDD1 and WLDD0, and eleven data word line layers (or data word lines) WLL0-WLL10. WLL0 is a source side data word line and WLDS1 is a dummy word line layer which is adjacent to the source side data word line. WLDS0 is another dummy word line layer which is adjacent to WLDS1. WLL10 is a drain side data word line and WLDD1 is a dummy word line layer which is adjacent to the drain side data word line. WLDD0 is another dummy word line layer which is adjacent to WLDD1. The dielectric layers are labelled as DL1-1L19. Further, regions of the stack which comprise NAND strings NS1 and NS2 are depicted. Each NAND string encompasses a memory hole 618 or 619 which is filled with materials which form memory cells adjacent to the word lines. Region 622 of the stack is shown in greater detail in FIG. 6C.

The stack includes a substrate 611. In one approach, a portion of the source line SL comprises an n-type source diffusion layer 611a in the substrate which is in contact with a source end of each string of memory cells in a block. The n-type source diffusion layer 611a is formed in a p-type well region 611b, which in turn is formed in an n-type well region 611c, which in turn is formed in a p-type semiconductor substrate 611d, in one possible implementation. The n-type source diffusion layer may be shared by all of the blocks in a plane, in one approach.

NS1 has a source-end 613 at a bottom 616b of the stack 616 and a drain-end 615 at a top 616a of the stack. Metal-filled slits 617 and 620 may be provided periodically across the stack as interconnects which extend through the stack, such as to connect the source line to a line above the stack. The slits may be used during the formation of the word lines and subsequently filled with metal. A portion of a bit line BL0 is also depicted. A conductive via 621 connects the drain-end 615 to BL0.

In one approach, the block of memory cells comprises a stack of alternating control gate and dielectric layers, and the memory cells are arranged in vertically extending memory holes in the stack.

In one approach, each block comprises a terraced edge in which vertical interconnects connect to each layer, including the SGS, WL and SGD layers, and extend upward to horizontal paths to voltage sources.

FIG. 6B depicts an example transistor 650. The transistor comprises a control gate CG, a drain D, a source S and a channel CH and may represent a memory cell or a select gate transistor, for example.

FIG. 6C depicts a close-up view of the region 622 of the stack of FIG. 6A. Memory cells are formed at the different levels of the stack at the intersection of a word line layer and a memory hole. In this example, SGD transistors 680 and 681 are provided above dummy memory cells 682 and 683 and a data memory cell MC. A number of layers can be deposited along the sidewall (SW) of the memory hole 630 and/or within each word line layer, e.g., using atomic layer deposition. For example, each pillar 699 or column which is formed by the materials within a memory hole can include a charge-trapping layer 663 or film such as silicon nitride (Si3N4) or other nitride, a tunneling layer 664, a channel 665 (e.g., comprising polysilicon), and a dielectric core 666. A word line layer can include a blocking oxide/block high-k material 660, a metal barrier 661, and a conductive metal 662 such as Tungsten as a control gate. For example, control gates 690, 691, 692, 693 and 694 are provided. In this example, all of the layers except the metal are provided in the memory hole. In other approaches, some of the layers can be in the control gate layer. Additional pillars are similarly formed in the different memory holes. A pillar can form a columnar active area (AA) of a NAND string.

Each memory string comprises a channel which extends continuously from the source-end select gate transistor to the drain-end select gate transistor.

When a memory cell is programmed, electrons are stored in a portion of the charge-trapping layer which is associated with the memory cell. These electrons are drawn into the charge-trapping layer from the channel, and through the tunneling layer. The Vth of a memory cell is increased in proportion to the amount of stored charge. During an erase operation, the electrons return to the channel.

Each of the memory holes can be filled with a plurality of annular layers comprising a blocking oxide layer, a charge trapping layer, a tunneling layer and a channel layer. A core region of each of the memory holes is filled with a body material, and the plurality of annular layers are between the core region and the word line in each of the memory holes.

The NAND string can be considered to have a floating body channel because the length of the channel is not formed on a substrate. Further, the NAND string is provided by a plurality of word line layers above one another in a stack, and separated from one another by dielectric layers.

Figure 7:
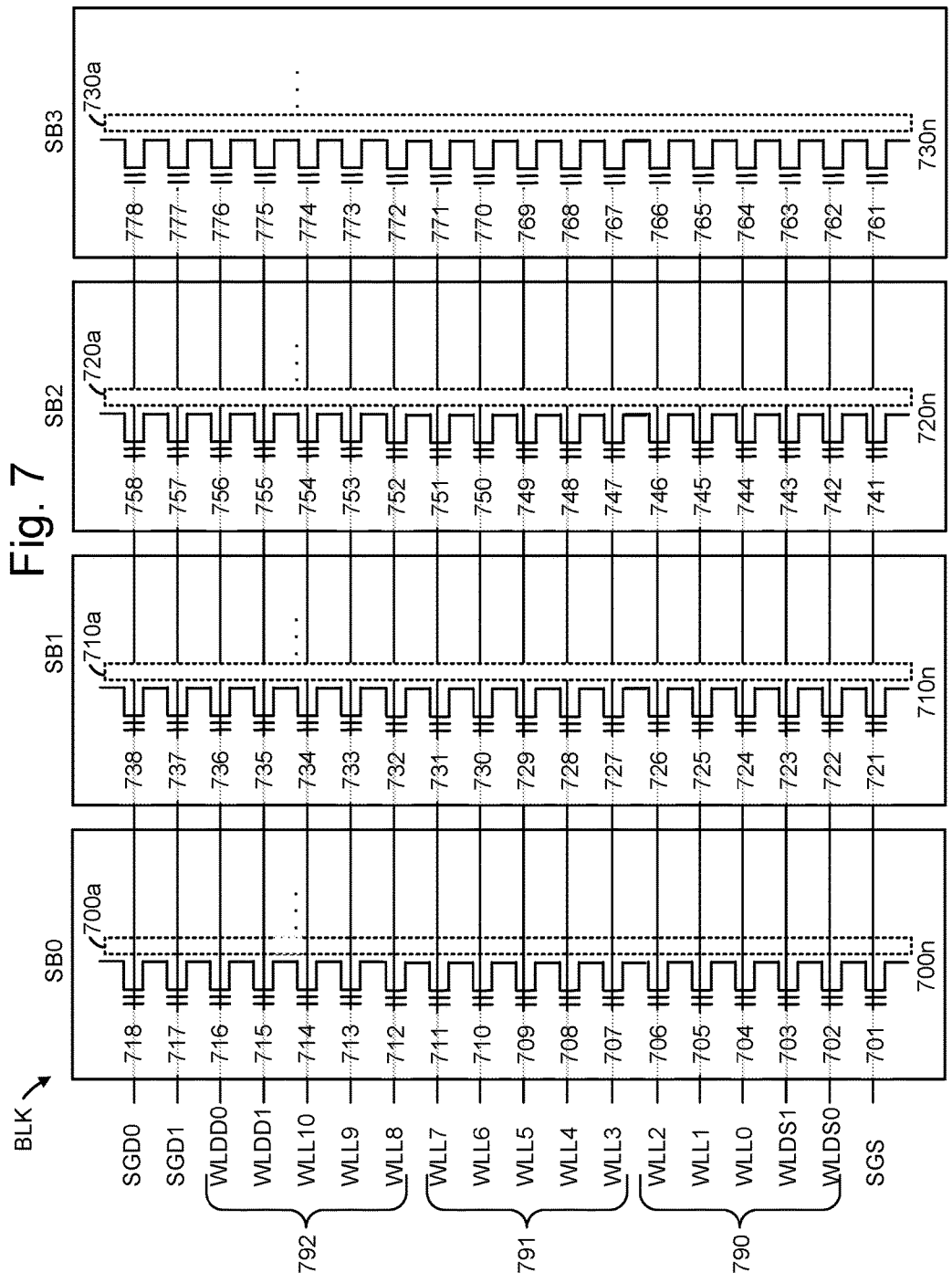
FIG. 7 depicts an example view of NAND strings in sub-blocks in a 3D configuration which is consistent with FIG. 6A.

FIG. 7 depicts an example view of NAND strings in sub-blocks in a 3D configuration which is consistent with FIG. 6A. Each sub-block includes multiple NAND strings, where one example NAND string is depicted. For example, SB0, SB1, SB2 and SB3 comprise example NAND strings 700n, 710n, 720n and 730n, respectively. The NAND strings have data word lines, dummy word lines and select gate lines consistent with FIG. 6A. In a block BLK, each sub-block comprises a set of NAND strings which extend in the x direction and which have a common SGD line. The NAND strings 700n, 710n, 720n and 730n are in sub-blocks SB0, SB1, SB2 and SB3, respectively. Programming of the block may occur one sub-block at a time. Within each sub-block, a word line programming order may be followed, e.g., starting at WL0, the source-end word line and proceeding one word line at a time to WLL10, the drain-end word line.

The NAND strings 700n, 710n, 720n and 730n have channels 700a, 710a, 720a and 730a, respectively.

Additionally, NAND string 700n includes SGS transistor 701, dummy memory cells 702 and 703, data memory cells 704, 705, 706, 707, 708, 709, 710, 711, 712, 713 and 714, dummy memory cells 715 and 716, and SGD transistors 717 and 718.

NAND string 710n includes SGS transistor 721, dummy memory cells 722 and 723, data memory cells 724, 725, 726, 727, 728, 729, 730, 731, 732, 733 and 734, dummy memory cells 735 and 736, and SGD transistors 737 and 738.

NAND string 720n includes SGS transistor 741, dummy memory cells 742 and 743, data memory cells 744, 745, 746, 747, 748, 749, 750, 751, 752, 753 and 754, dummy memory cells 755 and 756, and SGD transistors 757 and 758.

NAND string 730n includes SGS transistor 761, dummy memory cells 762 and 763, data memory cells 764, 765, 766, 767, 768, 769, 770, 771, 772, 773 and 774, dummy memory cells 775 and 776, and SGD transistors 777 and 778.

During a programming operation, the final Vth distribution can be achieved by using one or more programming passes. Each pass may use incremental step pulse programming, for instance. During a programming pass, program loops are performed for a selected word line. A program loop comprises a program portion in which a program voltage is applied to the word line followed by a verify portion in which one or more verify tests are performed. Each programmed state has a verify voltage which is used in the verify test for the state.

The word lines and associated memory cells may be arranged in different subsets, such as a source-end subset of word lines 790 (e.g., WLDS0-WLL2) adjacent to the source-end select gate transistors, a drain-end subset of word lines 792 (e.g., WLL8-WLDD0) adjacent to the drain-end select gate transistors, and a midrange subset of word lines 791 (e.g., WLL3-WLDD3) between the source-end subset of word lines and the drain-end subset of word lines. In one approach, the source-end subset of word lines encompasses a group of adjacent word lines including a bottom data or dummy word line in a stack, the drain-end subset of word lines encompasses a group of adjacent word lines including a top data or dummy word line in a stack, and a midrange subset of word lines encompasses a group of adjacent word lines including a word line which is at a midpoint in the stack. A midrange subset of word lines can also encompasses a set of adjacent word lines which is between the source-end and drain-end groups.

As described further below, including in FIGS. 19A and 19B, a time period in which a read disturb countermeasure is implemented can be a function of the subset in which the selected word line WLn is located. The time period can generally be a function of a position of the selected word line among the plurality of word lines WLL0-WLL10. The implementation of the countermeasure is more efficient when the same countermeasure is used when WLn is among multiple word lines in a subset. Although, it is possible for the implementation of the countermeasure to be customized for each selected word line position. In one approach, the countermeasure can be customized for both individual word line positions group of word lines. For example, the end data word lines WLL0 and WLL10 can be treated individually. Further, each subset typically comprises a group of adjacent word lines, although other options are possible. For example, a subset can comprise first and second group of adjacent word lines which are separated from another by at least one other word line.

Figure 8:
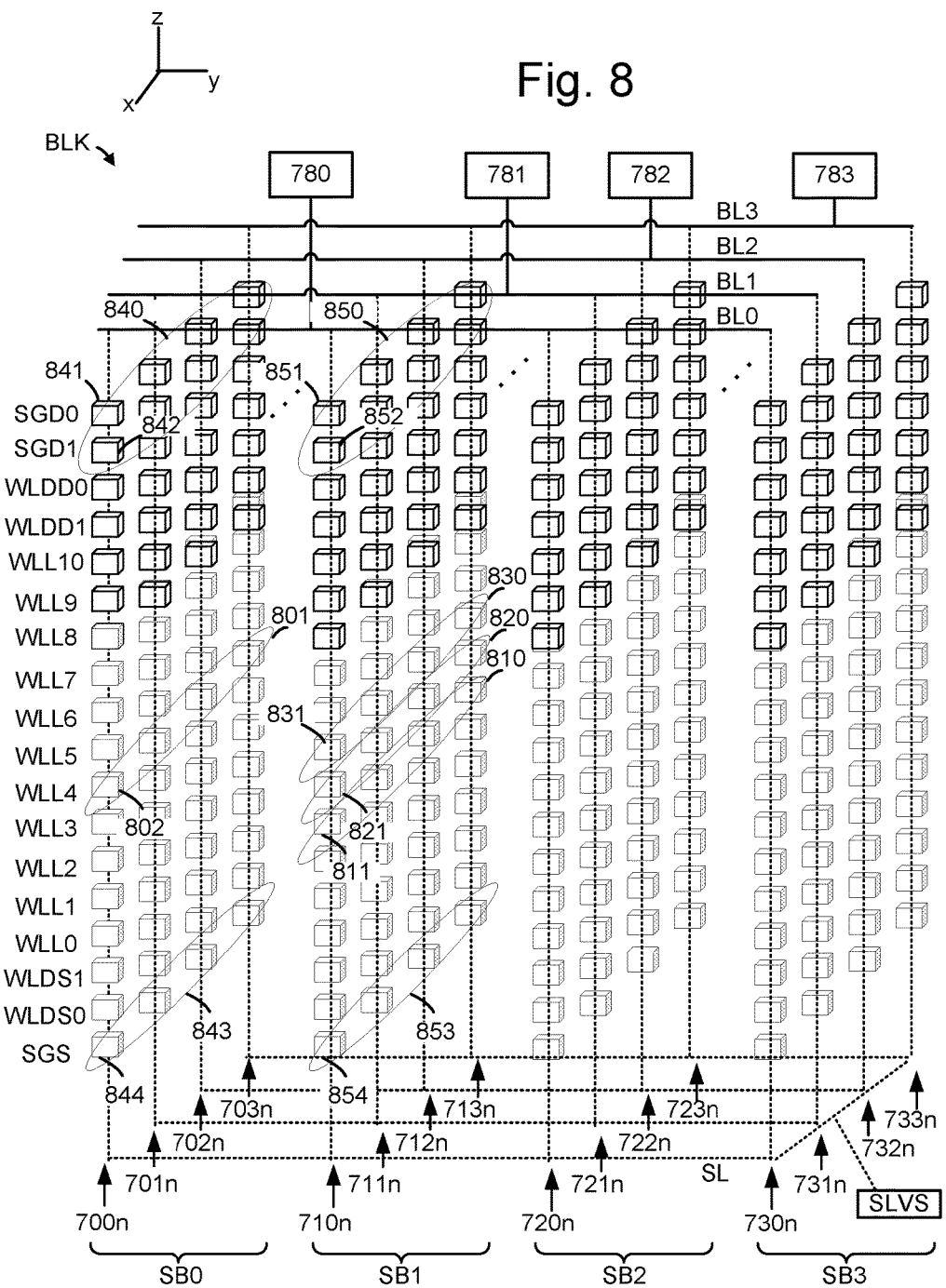
FIG. 8 depicts additional detail of the sub-blocks SB0-SB3 of FIG. 7.

FIG. 8 depicts additional detail of the sub-blocks SB0-SB3 of FIG. 7. Example memory cells are depicted which extend in the x direction along word lines in each sub-block. Each memory cell is depicted as a cube for simplicity. SB0 includes NAND strings 700n, 701n, 702n and 703n. SB1 includes NAND strings 710n, 711n, 712n and 713n. SB2 includes NAND strings 720n, 721n, 722n and 723n. SB3 includes NAND strings 730n, 731n, 732n and 733n. Bit lines are connected to sets of NAND strings. For example, a bit line BL0 is connected to NAND strings 700n, 710n, 720n and 730n, a bit line BL1 is connected to NAND strings 701n, 711n, 721n and 731n, a bit line BL2 is connected to NAND strings 702n, 712n, 722n and 732n, and a bit line BL3 is connected to NAND strings 703n, 713n, 723n and 733n. Sensing circuitry may be connected to each bit line. For example, sensing circuitry 780, 781, 782 and 783 is connected to bit lines BL0, BL1, BL2 and BL3. A bit line voltage source may be provided with the sensing circuitry.

Programming and reading can occur for selected cells in one word line and one sub-block at a time. This allows each selected cell to be controlled by a respective bit line and/or source line. For example, a set of memory cells 801, which includes an example memory cell 802, is connected to WLL4 in SB0. This set of memory cells may be programmed or read concurrently. An additional set of memory cells is connected to WLL4 in each of the other sub-blocks SB1-SB3. For example, a set of memory cells 820, which includes an example memory cell 821, is connected to WLL4 in SB1. Moreover, a set of memory cells 810, which includes an example memory cell 811, is connected to WLL3 in SB1, and a set of memory cells 830, which includes an example memory cell 831, is connected to WLL5 in SB1.

When the memory cells of WLL4 in SB0 are sensed, such as in a read operation or a verify test, the cells of WLL3 and WLL5 in SB1-SB3 are most susceptible to read disturb as described herein. WLL5, in particular, is most susceptible. The memory cells being sensed are the selected memory cells, the associated word line is a selected word line or word line layer and the associated sub-block is a selected sub-block. At this time, the memory cells not being sensed are the unselected memory cells (in SB0 on all word lines except WLn and in SB1-SB3 on all word lines). The word lines other than WLL4 are the unselected word lines or word line layers. The notations WLn, WLn−1 and WLn+1 may be used to represent a selected word line, an adjacent source-side unselected word line, and an adjacent drain-side unselected word line, respectively. In this example, WLn=WLL4, WLn−1=WLL3 and WLn+1=WLL5.

In this example, the source line SL or source region is driven at a voltage Vsl by a voltage source, SLVS.

Each memory string includes one or more SGD transistors at the drain-end and one or more SGS transistors at the source end. In this case, there are two SGD transistors and one SGS transistor. For example, SB0 has a set of SGD transistors 840, with example SGD transistors 841 and 842 in the memory string 700n. SB0 also has a set of SGS transistors 843, with an example SGS transistor 844 in the memory string 700n. Similarly, SB1 has a set of SGD transistors 850, with example SGD transistors 851 and 852 in the memory string 710n. SB1 also has a set of SGS transistors 853, with an example SGS transistor 854 in the memory string 710n.

Figure 9A:
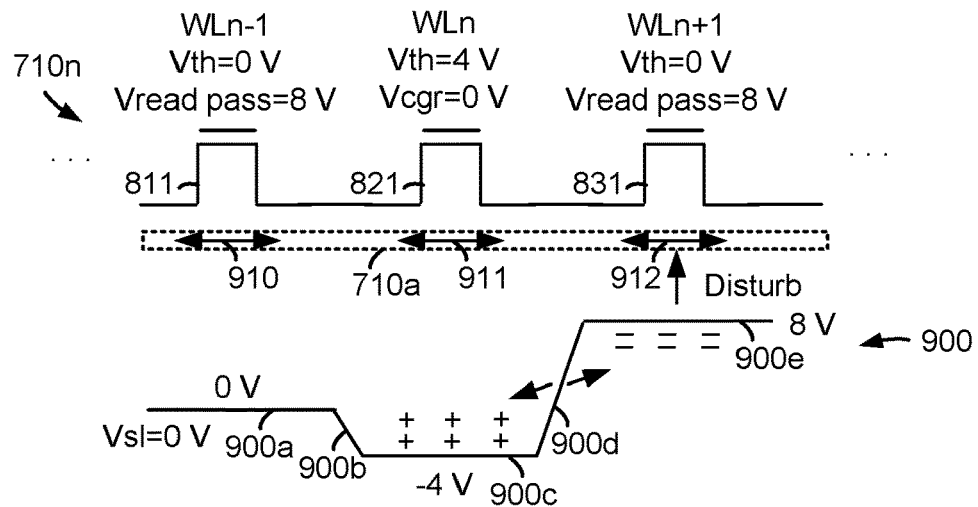
FIG. 9A depicts a plot of a channel voltage versus memory string position, for the case of SGS transistors connected in a block, when a read pass voltage is applied to unselected word lines and a control gate read voltage is applied to a selected word line.

FIG. 9A depicts a plot of a channel voltage versus memory string position, for the case of SGS transistors connected in a block, when a read pass voltage is applied to unselected word lines and a control gate read voltage is applied to a selected word line. In FIGS. 9A, 9B, 10A and 10B, a portion of the memory string 710n and its channel 710a of FIGS. 7 and 8 is depicted. The portion of the memory string shown includes the three memory cells 811, 821 and 831 of FIG. 8 which are connected to WLL3, WLL4 and WLL5, respectively. As an example, WLL4 is the selected word line WLn, so that WLL3 is WLn−1 and WLL5 is WLn+1. The memory cells 811, 821 and 831 are adjacent to channel portions 910, 911 and 912, respectively, of the channel. A plot 900 represents a magnitude of the channel voltage for to different channel portions. The plot includes plot portions 900a, 900c and 900e which represent the voltages in the channel portions 910, 911 and 912, respectively, and plot portions 900b and 900d which represent gradients between the plot portions 900a and 900c, and 900c and 900e, respectively.

In this case, the memory cells 811 and 831 are unselected and the memory cell 821 is selected. Each memory cell has a threshold voltage (Vth) and a control gate or word line voltage. Generally, the programming of the cells is random so that a memory string will have cells in different states. However, a worst case scenario can be considered in which the channel region adjacent to a selected memory cell is non-conductive or cutoff. For example, the memory cell 821 is in the C state with Vth=4 V and the control gate read voltage Vcgr=0 V, so the channel region adjacent to this memory cell is cutoff.

In this example, the memory cells 811 and 831 are in the erased state with Vth=0 V and the word line voltage is at Vread pass=8 V. This configuration represents a situation in which Vread pass is initially provided on the unselected word lines. Assuming Vsl=0 V, with the SGS transistor 854 (FIG. 8) in a conductive state, 0 V is provided in the channel portion 910, adjacent to WLn−1. The memory cells between the cell 811 and the SGS transistor in the string 710n are all in a conductive state due to Vread pass so that there is no cutoff in the channel between the cell 811 and the SGS transistor. −4 V is provided in the channel portion 911 since this voltage is initially equal to the difference between Vcgr and the Vth of the cell 821, e.g., 0–4 V=−4 V. 8 V is provided in the channel portion 912, assuming the SGD transistor is non-conductive. In this case, the voltage of the channel portion 912 floats (e.g., is not driven), since this channel portion is cutoff on the source side at WLn and on the drain side at the SGD transistor. The voltage of this channel portion is increased to about 8 V due to capacitive coupling from the increase of the associated word line voltages. The voltage of the channel portion 910 is not increased by capacitive coupling from the associated word line voltages because this channel portion is directly driven by Vsl at 0 V, for instance (due to the SGS transistor being in a conductive state).

The plot portion 900*b* represents a small channel gradient (e.g., 4 V) between the cells 811 and 821. This results in a relatively small amount of disturb for the cell 811, as shown in FIG. 11B. However, the plot portion 900*d* represents a very large, e.g., 12 V, channel gradient between the cells 821 and 831. Due to this channel gradient, electron-hole pairs will be generated in the channel, and the holes (denoted by "+") will move toward the cell 821 while the electrons (denoted by "−") move toward the cell 831. With the relatively high voltage of Vread pass applied to WLn+1, some of the electrons can be drawn into the charge trapping region of the cell 831. This results in a very large amount of disturb for the cell 831, as shown in FIG. 11C.

Figure 9B:
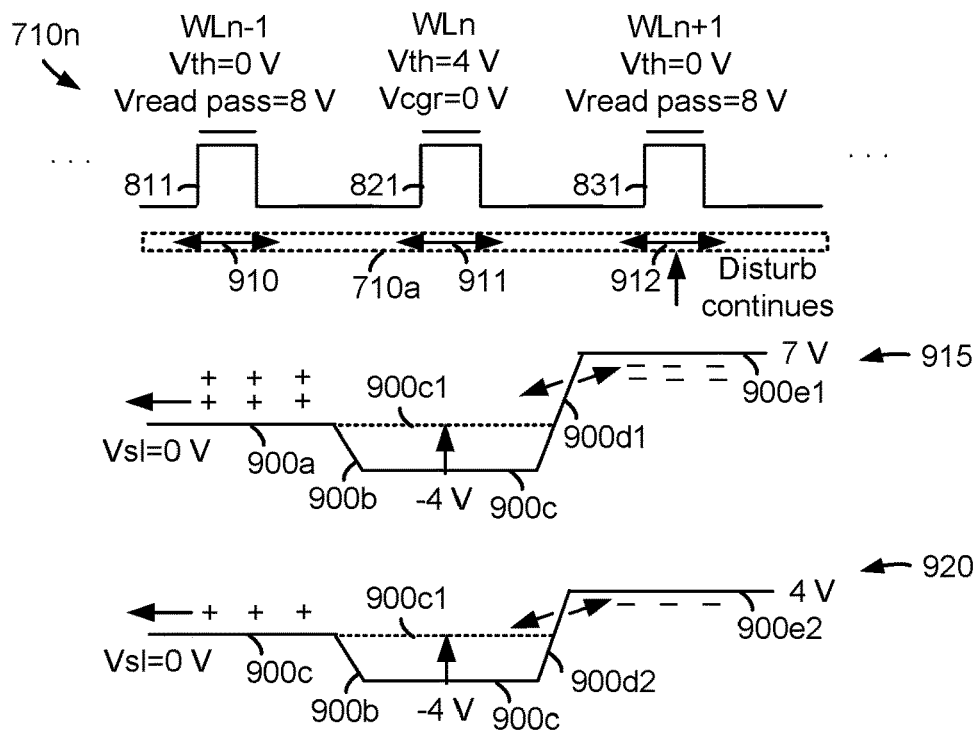
FIG. 9B depicts a plot of a channel voltage versus memory string position, a short time after the scenario in FIG. 9A, when holes in the channel under the selected word line move toward the source end of the memory string.

FIG. 9B depicts a plot of a channel voltage versus memory string position, a short time after the scenario in FIG. 9A, when holes in the channel under the selected word line move toward the source end of the memory string. A plot 915 represents a magnitude of the channel voltage for different portions of the channel. The plot portions 900*a*, 900*b* and 900*c* are the same as in FIG. 9B. The plot portion 900*e*1 represents the voltage in the channel portion 912 and the plot portion 900*d*1 represents a gradient between the plot portions 900*c* and 900*e*1.

The holes will be attracted to the source end of the memory string and move away from the channel portion 911. This results in the voltage increasing from −4 to 0 V, for instance, in the channel portion 911, as depicted by the plot portion 900*c*1. However, the electrons will remain in the channel portion 912 so that additional injection type of read disturb of the cell 831 occurs. In particular, the voltage in the channel portion 912 may decrease slightly to 7 V so that the channel gradient represented by the plot portion 900*e*1 is about 7 V. This is large enough to continue to create read disturb for the cell 831. The channel portion on the drain side of the cell 821 (which includes the channel portion 912 and other channel portions of other cells on the drain side of the cell 831) has a relatively high capacitance compared to the channel portion 911 so that the voltage of the channel portion on the drain side of the cell will change relatively slowly.

In contrast, using the read disturb countermeasure, the plot 920 represents a magnitude of the channel voltage for different portions of the channel. It includes the same plot portions as the plot 915 except that the plot portion 900*e*2 shows that the voltage in the channel portion 912 adjacent to the cell 831 is at a reduced level such as 4 V instead of 8 V in the plot 915, so that the channel gradient represented by the plot portion 900*d*2 is about 8 V (e.g., 4--−4 V) initially and then 4 V (e.g., 4-0 V). This results in a much smaller read disturb for the cell 831 compared to the plot 915. Generally, the drain side potential of the channel is inversely proportional to the on time for the SGD_unsel transistors. That is, a longer on time results in a lower potential.

Figure 10A:
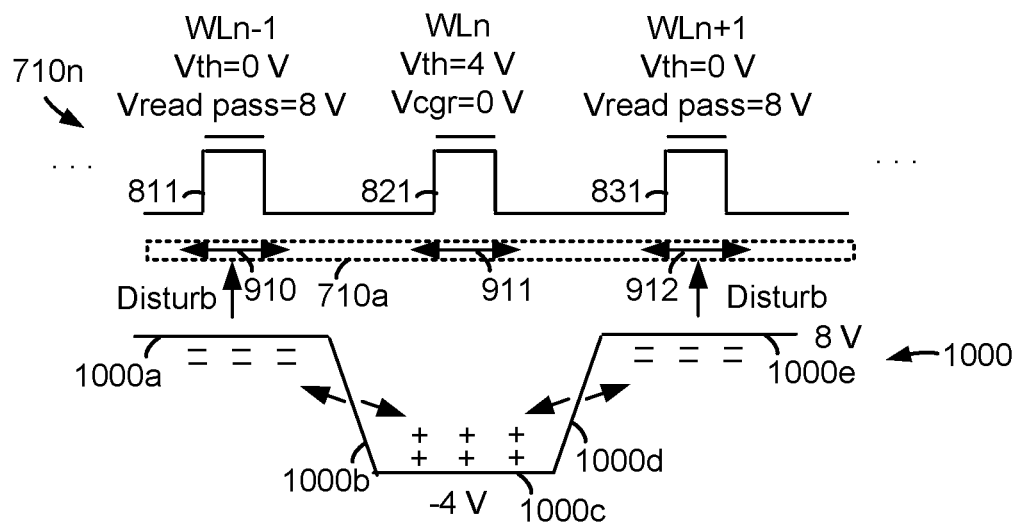
FIG. 10A depicts a plot of a channel voltage versus memory string position, for the case of SGS transistors connected in a sub-block but not a block, when a read pass voltage is applied to unselected word lines and a control gate read voltage is applied to a selected word line.

FIG. 10A depicts a plot of a channel voltage versus memory string position, for the case of SGS transistors connected in a sub-block but not a block, when a read pass voltage is applied to unselected word lines and a control gate read voltage is applied to a selected word line. This situation can be compared with the situation in FIG. 9A. A plot 1000 represents a magnitude of the channel voltage for different portions of the channel. The plot includes plot portions 1000*a*, 1000*c* and 1000*e* which represent the voltages in the channel portions 910, 911 and 912, respectively, and plot portions 1000*b* and 1000*d* which represent gradients between the plot portions 1000*a* and 1000*c*, and 1000*c* and 1000*e*, respectively.

The memory cells 811 and 831 are in the erased state with Vth=0 V and the word line voltage is at Vread pass=8 V. This configuration represents a situation in which Vread pass is initially provided on the unselected word lines. The SGS transistor 854 is provided in a non-conductive state, so that Vsl is not passed to the channel portion adjacent to the cell 811. Instead, this channel portion has a floating voltage since it is cutoff on the source side at the SGS transistor and on the drain side at the selected memory cell 821. As a result, the channel portion is capacitively coupled higher to about 8 V by the ramping up of the associated unselected word line voltages to Vread pass.

The channel voltage on the drain side of the selected memory cell 821 is a mirror image of the source side. The SGD transistor 851 (FIG. 8) is also provided in a non-conductive state, so that Vbl is not passed to the channel portion adjacent to the cell 831. Instead, this channel portion has a floating voltage since it is cutoff on the drain side at the SGD transistor and on the source side at the selected memory cell 821. As a result, the channel portion is capacitively coupled higher to about 8 V by the ramping up of the associated unselected word line voltages to Vread pass.

The plot portion 1000*b* represents a large channel gradient, e.g., 12 V, between the cells 811 and 821. This results in a significant amount of disturb for the cell 811, as shown in FIG. 11D. Similarly, the plot portion 1000*d* represents a large channel gradient between the cells 821 and 831. This results in a significant amount of disturb for the cell 831, as shown in FIG. 11E. However, the total amount of disturb is moderated by the fact that the disturb occurs for a shorter period of time than in the examples of FIGS. 9A and 9B.

Figure 10B:
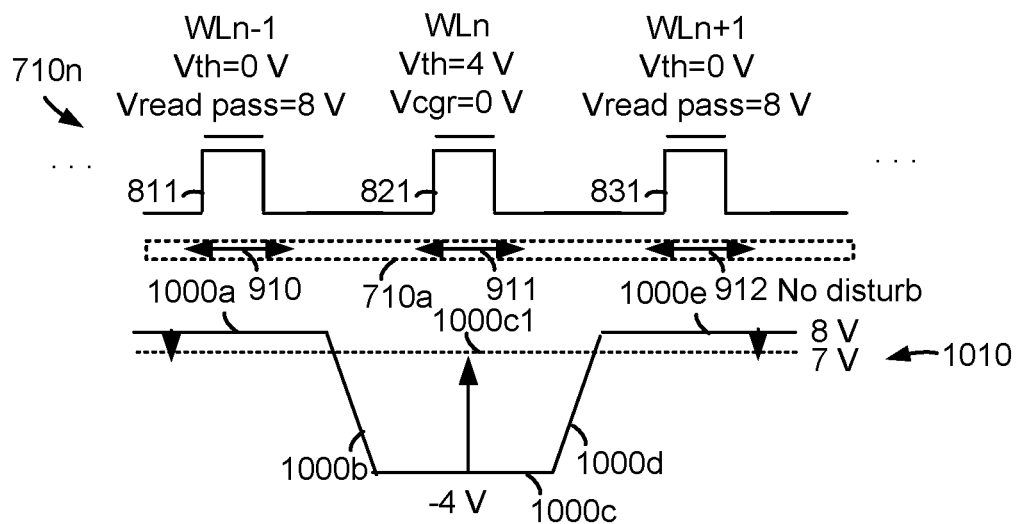
FIG. 10B depicts a plot of a channel voltage versus memory string position, a short time after the scenario in FIG. 10A, when holes in the channel under the selected word line move toward the source end and the drain end of the memory string.

FIG. 10B depicts a plot of a channel voltage versus memory string position, a short time after the scenario in FIG. 10A, when holes in the channel portion 911 under the selected word line move toward the source end and the drain end of the memory string. This situation can be compared with the situation in FIG. 9B. The holes recombine with the electrons to move the entire channel to an equilibrium point of about 7 V. The increase of the voltage of the channel portion 911 is represented by the plot portion 1000*c* moving to the plot portion 1000*c*1. See plot 1010. When the channel voltage is uniform in the channel, no channel gradient exists and injection type read disturb does not occur.

Thus, for the disconnected SGS transistor case, we observe a similar dependence of the amount of read disturb on the selected word line position. Specifically, a large disturb is seen on WLn+1 when WLn is at the source-end and a large disturb is seen on WLn−1 when WLn is at the drain-end. Overall, the worst disturb is on edge word lines rather than midrange word lines.

FIG. 11A depicts an example threshold voltage (Vth) distribution of a set of memory cells connected to a selected word line WLn in a selected sub-block after a single-pass programming operation, where four data states are used. A Vth distribution 1100 is provided for erased (Er) state memory cells. Three Vth distributions 1110, 1112 and 1114 represent assigned data states A, B and C, respectively, which are reached by memory cells when their Vth exceeds the verify voltage VvA, VvB or VvC, respectively. This example uses four data states. Other numbers of data states can be used as well, such as eight or sixteen. Read voltages VrA, VrB and VrC are used to read data from a set of cells having this Vth distribution. These verify voltages and read voltages are examples of control gate read levels of the selected word line voltage.

A programming operation can use one or more programming passes. A single-pass programming operation involves one sequence of multiple program-verify operations (or program loops) which are performed starting from an initial Vpgm level and proceeding to a final Vpgm level until the threshold voltages of a set of selected memory cells reach the verify voltages of the assigned data states. All memory cells may initially be in the erased state at the beginning of the programming pass. After the programming pass is completed, the data can be read from the memory cells using read voltages which are between the Vth distributions. At the same time, a read pass voltage, Vread pass (e.g., 8 to 10 V), is applied to the remaining word lines. By testing whether the Vth of a given memory cell is above or below one or more of the read reference voltages, the system can determine the data state which is represented by a memory cell. These voltages are demarcation voltages because they demarcate between Vth ranges of different data states.

Moreover, the data which is programmed or read can be arranged in pages. For example, with four data states, or two bits per cell, two pages of data can be stored. An example encoding of bits for the Er, A, B and C states is 11, 10, 00 and 01, respectively, in the format of upper page (UP) bit/lower page (LP) bit. A lower page read may use VrA and VrC and an upper page read may use VrB. See also FIG. 12C.

FIG. 11B depicts an example Vth distribution of a set of memory cells connected to WLn−1 in an unselected sub-block showing the effects of read disturb, for the case of SGS transistors connected in a block, and for a source-end, midrange and a drain-end WLn. The sub-block which has been programmed as in FIG. 11A now becomes an unselected sub-block which is subject to read disturb as other sub-blocks are subject to read stress by repeated read or programming operations. The SGS transistors of a block, including the SGS transistors in the different sub-blocks of the block, have their control gates connected by a common conductive layer in the stacked 3D memory device, in this example. As a result, the SGS transistors are driven at a common control gate voltage and there is no opportunity to set the voltage differently for a selected sub-block and the unselected sub-blocks.

The plots 1100a, 1100b and 1100c represent the erased state Vth with read disturb when the selected word line WLn is at a source-end, midrange or a drain-end, respectively, of the set of word lines in a stack. For example, WLn may be in a source-end, midrange or a drain-end subset of word lines, such as described in connection with FIGS. 7, 19A and 19B. The read disturb results in the upper tail of the distribution increasing above VrA, leading to read errors. The amount of read disturb on WLn−1 is relatively small compared to WLn+1. Moreover, the read disturb is slightly greater for the case of the source-end WLn than the drain-end WLn.

As mentioned, read disturb is primarily seen on the memory cells in the unselected sub-blocks. In the selected sub-block, the drain-end and source-end transistors can both be provided in a conductive state so that channel gradients as described in FIGS. 9A, 9B, 10A and 10B are avoided.

FIG. 11C depicts an example Vth distribution of a set of memory cells connected to WLn+1 in an unselected sub-block showing the effects of read disturb, for the case of SGS transistors connected in a block, and for a source-end, midrange and a drain-end WLn. The plots 1100d, 1100e and 1100f represent the erased state Vth with read disturb when the selected word line WLn is at a source-end, midrange or a drain-end, respectively, of the set of word lines in a stack. The read disturb is very significant and unacceptable on WLn+1. The erased state Vth is increased as high as the highest programmed state, e.g., the C state. The read disturb is similar when WLn is at the source-end or midrange. This read disturb shows a pronounced peak at the highest Vth levels, so this represents the worst case read disturb.

The read disturb for the case of WLn being at the drain-end is greater across the A and B state Vth levels but smaller at the highest Vth level, so this represents a lower amount of read disturb compared to when WLn is at the source-end or midrange. Accordingly, the memory device configuration in which the SGS transistors of selected and unselected sub-blocks are connected to one another can result in an unacceptable amount of read disturb in the unselected sub-blocks if countermeasures as described herein are not taken. Moreover, a read disturb countermeasure should be stronger when WLn is at the source-end or midrange compared to when WLn is at the drain-end.

Read disturb countermeasures are discussed further below. One approach involves an SGD_unsel on period which is adjusted based on the position of WLn such as shown in FIGS. 19A and 19B.

The Vth distributions shown in FIG. 11B to 11E are based on accumulated read disturb over many, e.g., thousands, of read cycles. Moreover, a worst case scenario was tested in which the cells connected to the selected word line are in the highest programmed state while the remaining cells connected to the unselected word lines are in the erased state.

FIG. 11D depicts an example Vth distribution of a set of memory cells connected to WLn−1 in an unselected sub-block showing the effects of read disturb, for the case of SGS transistors connected in a sub-block but not a block, and for a source-end, midrange and a drain-end WLn. In this case, the control gate voltage of the SGS transistors can be optimized separately for the selected and unselected sub-blocks. The plots 1120a, 1120b and 1120c represent the erased state Vth with read disturb when the selected word line WLn is at a source-end, midrange or a drain-end, respectively, of the set of word lines in a stack. The read disturb is slightly greater than in the comparative case of WLn−1 in FIG. 11B but not as great as the case of WLn+1 in FIG. 11C.

FIG. 11E depicts an example Vth distribution of a set of memory cells connected to WLn+1 in an unselected sub-block showing the effects of read disturb, for the case of SGS transistors connected in a sub-block but not a block, and for a source-end, midrange and a drain-end WLn. The plots 1130a, 1130b and 1130c represent the erased state Vth with read disturb when the selected word line WLn is at a source-end, midrange or a drain-end, respectively, of the set of word lines in a stack. The read disturb is similar to the case of WLn−1 in FIG. 11D but not as great as the case of WLn+1 in FIG. 11C.

FIG. 12A to 12C show an example two-pass programming operation as an example of a multi-pass programming operation.

FIG. 12A depicts an initial Vth distribution of memory cells in an example two-pass programming operation involving four data states. Initially, the cells are all in the erased (Er) state as represented by the threshold distribution (Vth) distribution 1200. The vertical axis indicates the number of cells and the horizontal axis indicates a Vth. The techniques for reducing read disturb may be used in single-pass or multi-pass programming, in addition to in a read operation. This is an example of multi-pass programming while FIG. 11A provides an example of single pass programming.

FIG. 12B depicts a Vth distribution which results after a first pass of the example two-pass programming operation of FIG. 12A. Based on write data as indicated, the cells which are to remain in the Er state, or programmed to the A state, are represented by the Vth distribution 1200, while the cells which are to be programmed to the B and C states are programmed to an intermediate (INT) distribution 1202. This programming pass may be referred to as an intermediate pass in which a verify level of VvINT is used. The programming pass results in one page of data being stored in the memory cells, where 1x denotes one state and 0x denotes another state (x is a placeholder).

FIG. 12C depicts a Vth distribution which results after a second pass of the example two-pass programming operation of FIG. 12A. Based on write data as indicated, the cells which are to remain in the Er state are represented by the Vth distribution 1200. The cells which are to be programmed to the A state using a verify voltage of VvA are represented by the distribution 1210. The cells which are to be programmed to the B and C states using verify voltages of VvB and VvC, respectively, are represented by the distributions 1212 and 1214, respectively. Each data state represents two bits of data as indicated. The programming pass results in another page of data being stored in the memory cells. The bit sequences 11, 10, 00 and 01 are used for the Er, A, B and C states, respectively. Generally, a multi-pass programming process can help in achieving narrower Vth distributions, especially for the higher states. Read voltages VrA, VrB and VrC can be used for reading the states of the cells in a read operation.

FIG. 13 depicts an example Vth distribution of a set of memory cells connected to a selected word line after a programming operation, where eight data states are used. Single-pass or multi-pass programming may be used to obtain this Vth distribution. Based on the write data as indicated, the cells which are to remain in the Er state are represented by the Vth distribution 1300. The cells which are to be programmed to the A, B, C, D, E, F and G states using verify voltages of VvA, VvB, VvC, VvD, VvE, VvF and VvG, respectively, are represented by the Vth distributions 1301, 1302, 1303, 1304, 1305, 1306 and 1307, respectively. Each data state represents three bits of data as indicated. Read voltages VrA, VrB, VrC, VrD, VrE, VrF and VrG can be used for reading the states of the cells in a read operation. These verify voltages and read voltages are examples of control gate read levels of the selected word line voltage. Other example programming operations may use additional data states and/or programming passes. For example, sixteen data state are possible.

With eight data states, or three bits per cell, three pages of data can be stored. An example encoding of bits for the A, B, C, D, E, F and G states is 111, 110, 100, 000, 010, 011, 001 and 101, respectively. The data of the lower page can be determined by reading the memory cells using read voltages of VrA and VrE. The data of the middle page can be determined by reading the memory cells using read voltages of VrB, VrD and VrF. The data of the upper page can be determined by reading the memory cells using read voltages of VrC and VrG.

Figure 14A:
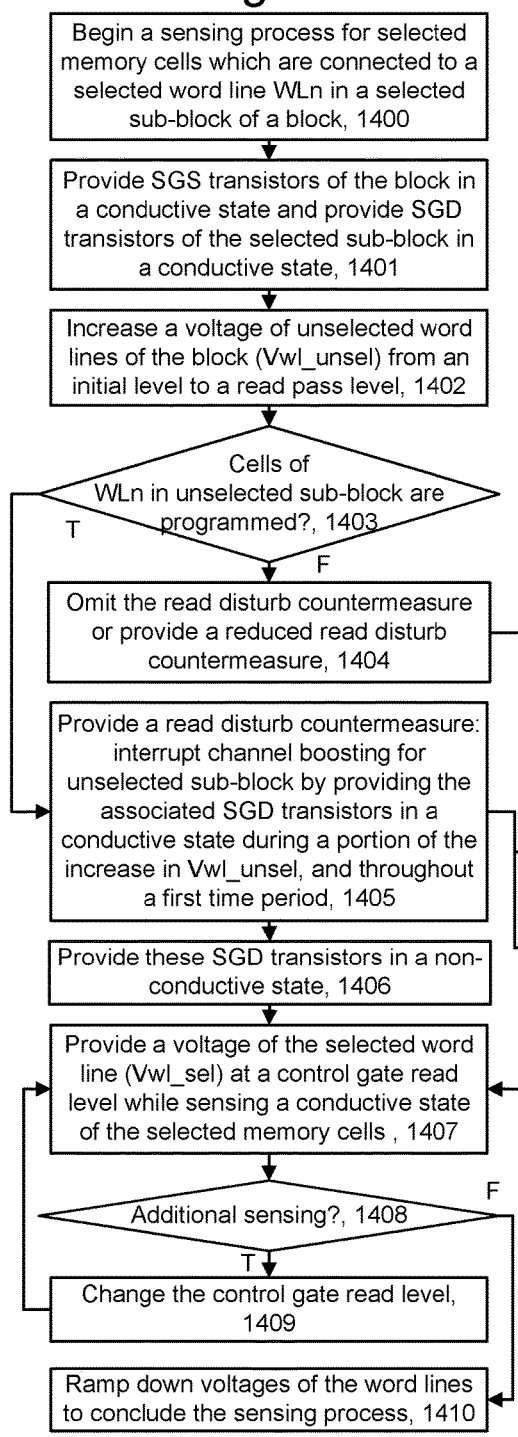
FIG. 14A depicts an example sensing process which reduces read disturb.

FIG. 14A depicts an example sensing process which reduces read disturb. A sensing process can occur, e.g., as a verify test in a programming operation, where the verify test determines whether the Vth of a cell exceeds a verify voltage of its assigned data state, or in a read operation which involves ascertaining the data state of a memory cell (after it has been programmed) by determining a highest read voltage which results in the memory cell being in a non-conductive state and/or a lowest read voltage which results in the memory cell being in a conductive state. A sensing process can involve applying one or more voltages to a selected word line while sensing whether the associated memory cells are in a conductive or non-conductive state.

Step 1400 begins a sensing process for selected memory cells which are connected to a selected word line WLn in a selected sub-block of a block. For example, in FIG. 8, assume SB0 is the selected sub-block and SB1-SB3 are unselected sub-blocks. The selected memory cells such as the memory cell 802 are in the set of memory cells 801, and WLL4 is the selected word line. Step 1401 includes providing the SGS transistors of the block (including both the selected sub-block and the unselected sub-blocks) in a conductive state and providing SGD transistors of the selected sub-block in a conductive state. When multiple SGD transistors are present in a memory string, they may receive the same control gate voltage, in one approach. In FIG. 8, the SGS transistors of the block can include those in the sets 843 and 853. The SGD transistors of the selected sub-block can include those in the set 840. Providing a transistor in a conductive state can involve applying a control gate voltage which exceeds the Vth of the transistor plus a margin. For example, see Vsgs and Vsgd_sel in FIG. 17D.

Step 1402 includes increasing a voltage of unselected word lines of the block (Vwl_unsel) from an initial level to a read pass level. For example, see FIG. 17A. A decision step 1403 determines whether memory cells connected to WLn in the unselected sub-blocks are programmed. When these memory cells are all in the erased state, a channel gradient will not occur as described in connected with FIGS. 11B and 11C. This is because each memory cell connected to an unselected word line in an unselected sub-block will be in a conductive state when the read voltage is applied, and each memory cell connected to WLn in an unselected sub-block will be in a conductive state when the control gate read voltage is applied. In this case, the channel is not cutoff at WLn, so that Vsl can be provided throughout the channel to avoid the formation of a gradient. Generally, step 1403 can determine whether memory cells connected to WLn in the unselected sub-block might cutoff the channel. This involves determining whether memory cells connected to WLn in the unselected sub-block have a Vth greater than the control gate read level. Step 1403 can determine whether an unselected sub-block contains programmed memory cells.

If decision step 1403 is false, step 1404 involves omitting the injection-type read disturb countermeasure for the unselected sub-blocks or providing a reduced injection-type read disturb countermeasure. In one approach, the injection-type read disturb countermeasure is not used for the unselected sub-blocks when they are not programmed, or at least when the memory cells connected to WLn in the unselected sub-blocks are not programmed. For example, some of the cells in a sub-block may be programmed but not others. Based on a word line programming order, it is possible that cells of one or more source side word lines are programmed while cells of remaining word lines are not programmed. By knowing that a cell is connected to word lines which have been programmed, it can be assumed that the cell is programmed. (It could be in the erased state but more likely is in a programmed state). By knowing that a cell is connected to word lines which have not been programmed, it can be concluded that the cell is not programmed. (It is in the erased state).

In another approach, the injection-type read disturb countermeasure is used for the unselected sub-blocks when they are not programmed, or when the memory cells connected to WLn in the unselected sub-blocks are not programmed, but the countermeasure is less severe compared to when the unselected sub-blocks are programmed. For example, the SGD transistors may be made conductive during the increase in Vwl_unsel for a second time period which is shorter than the first time period which applies when the unselected sub-blocks are programmed. A less severe countermeasure can be provided as a preventative measure. The control or the memory array can store data indicating whether each block and/or word line has been programmed, or an extent to which each block and/or word line has been programmed. For the case of a partially programmed sub-block, data can be stored which identifies the last programmed word line.

One advantage to not using an injection-type read disturb countermeasure, or using a less severe read disturb countermeasure as described herein, is that the channels are boosted to a higher level, so that normal read disturb is more strongly discouraged. Power consumption can also be reduced by avoiding, or reducing the duration of, the temporary increase in Vsgd_unsel during the increase in Vwl_unsel which provides the injection-type read disturb countermeasure. Further, time savings can be achieved in the sensing operation when a shorter on time for the SGD transistors allows a shorter ramp up time of the unselected word lines.

After step 1404, step 1407 is reached. This step involves providing a voltage of the selected word line (Vwl_sel) at a control gate read level while sensing a conductive state of the selected memory cells. If decision step 1403 is true, step 1405 includes providing a read disturb countermeasure by interrupting channel boosting for the unselected sub-block by providing the associated SGD transistors in a conductive state during a portion of the increase in Vwl_unsel, and throughout a first time period. Step 1406 then includes providing these SGD transistors in a non-conductive state. See the plot 1741 in FIG. 17E and the plot 1751 in FIG. 17F which shows providing the associated SGD transistors in a conductive state during a portion of the increase in Vwl_unsel. In connection with step 1405, step 1405a sets the first time period to be longer when the selected word line is in a source-end or midrange subset of word lines rather than a drain-end subset. See the SGD_unsel on period in the plots of FIGS. 19A and 19B. By using a shorter SGD_unsel on period when warranted, a time penalty can be reduced. For example, the ramp up time of the unselected word line voltage may be a function of the SGD_unsel on period. If the SGD_unsel on period is reduced, the ramp up time and overall time for a sensing process can be reduced. Moreover, FN type read disturb can be reduced by avoiding a longer SGD_unsel on period when warranted. A longer SGD_unsel on period results in a lower channel boosting level and a higher likelihood of FN type read disturb.

Also in connection with step 1405, step 1405b sets the increase or ramp up time of Vwl_unsel in step 1402 as a function of the first time period. The ramp up time can be longer when the first time period is longer, to accommodate the first time period without making the ramp up time excessively long. See FIG. 14B.

A decision step 1408 determines is there is additional sensing to perform. For example, multiple verify tests may be performed sequentially in a program loop as in FIG. 16, or sensing may occur at multiple read levels such as in FIG. 17A. If decision step 1408 is false, step 1410 ramps down the voltages of the word lines to conclude the sensing process. If decision step 1408 is true, step 1409 changes the control gate read level and step 1407 is repeated. Sensing can occur at one or more control gate read levels after the channel voltages are set in the unselected sub-blocks.

Figure 14C:
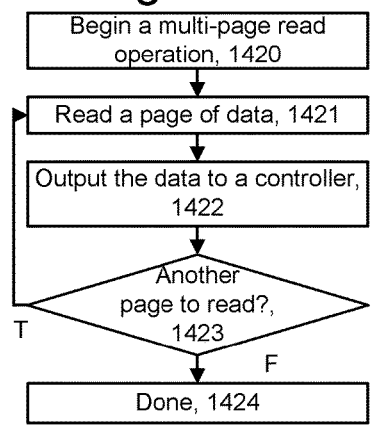
FIG. 14C depicts an example multi-page read operation which can use the sensing process of FIG. 14A.
Figure 14B:
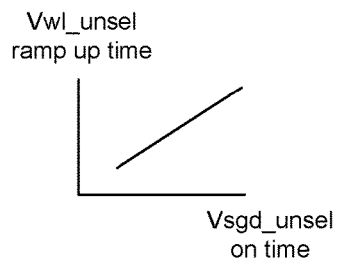
FIG. 14B depicts an example plot of Vwl_unsel ramp up time versus Vsgd_unsel on time, consistent with step 1405b.

FIG. 14B depicts an example plot of Vwl_unsel ramp up time versus Vsgd_unsel on time, consistent with step 1405b. As mentioned, the ramp up time can be longer when the first time period is longer. See FIG. 17E where the Vwl_unsel ramp up time is t1-t4 and the Vsgd_unsel on time is dt1 (both relatively short), and FIG. 17F where the Vwl_unsel ramp up time is t1-t6 and the Vsgd_unsel on time is dt2 (both relatively long).

FIG. 14C depicts an example multi-page read operation which can use the sensing process of FIG. 14A. As an example, with four data states as in FIG. 11, one page may be read using VrA and VrC and another page may be read using VrB. The read data from each page s is output from the sense circuits to the controller, in one approach. Step 1420 begins a multi-page read operation. Step 1421 includes reading a page of data, such as by using the process of FIG. 14A. Step 1422 includes outputting the data to a controller. If a decision step 1423 determines that there is another page to read, step 1421 is repeated. If the decision step 1423 determines that there is no further page to read, the read operation is done at step 1424.

Figure 14D:
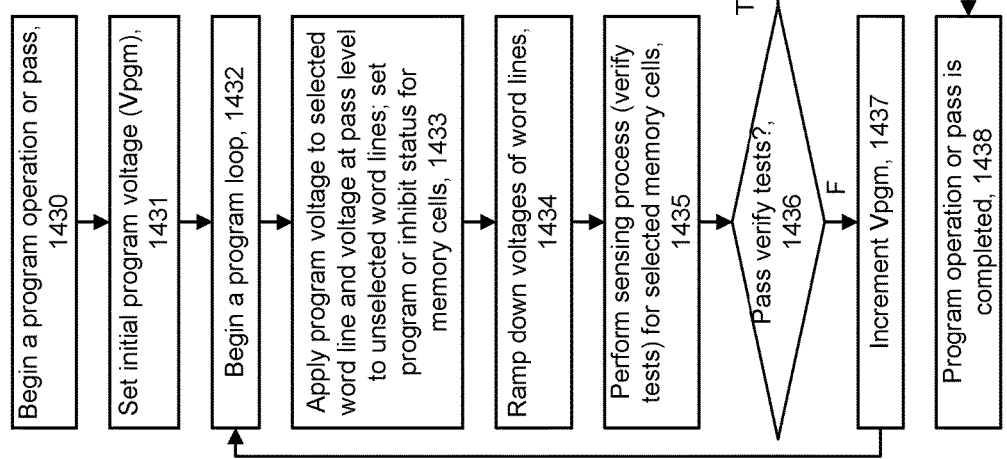
FIG. 14D depicts an example programming process which can use the sensing process of FIG. 14A when performing verify tests.

FIG. 14D depicts an example programming process which can use the sensing process of FIG. 14A when performing verify tests. Step 1430 begins a program operation or pass. In one approach, a programming operation comprise one or more program passes. Step 1431 sets an initial program voltage (Vpgm). See, e.g., FIGS. 15 and 16 and Vpgm_init1 and Vpgm_init2, respectively. Step 1432 begins a program loop.

Step 1433 applies the program voltage to a selected word line and a voltage at a read pass level to unselected word lines (e.g., unselected data and dummy word lines). The selected word line could be one of WL0-WL10 in FIG. 7 or 8, for instance. This step also includes setting a program or inhibit status for the memory cells connected to the selected word line. A cell with an inhibit status has the associated bit line of the memory string set to a high level, e.g., 2-3 V which inhibits programming. A cell with a program status has the associated bit line of the memory string set to a low level, e.g., 0 V which allows programming. Step 1434 ramps down the voltages of the word lines.

Step 1435 includes performing a sensing process, e.g., one or more verify tests, for the selected memory cells. For example, the process of FIG. 14A may be used. This can involve applying a voltage at one or more control gate read levels to the selected memory cells via the selected word line while applying a voltage at a read pass level to unselected word lines while sensing the memory cells. The sensing of a memory cell can involve detecting a level of a current in the associated memory string. See also FIGS. 17A and 17B. The verify test determines whether each selected memory cell is in a conductive or non-conductive state. If decision step 1436 is true, the program operation or pass is completed at step 1438. If the decision step 1436 is false, step 1437 increments Vpgm and another program loop begins at step 1432. In a given program loop, a verify test may be performed for one or more assigned data states. For each assigned data state, the corresponding verify test is passed if all, or nearly all, of the memory cells which have the assigned data state pass the verify test. For example, the verify test may be passed if all, or nearly all, of the memory cells which have the assigned data state have a Vth greater than the control gate read level. This may be indicated by a current in the memory string exceeding a specified level as measured by a decay in the bit line voltage. See FIG. 17B.

FIG. 15 depicts a series of program loops in an example of a programming pass for a lower page of data, consistent with FIG. 12B. In FIGS. 15 and 16, the horizontal axis depicts program loop, and the vertical axis depicts control gate or word line voltage. The pulse train 1500 includes a series of program pulses 1501-1509. Example verify pulses include an INT-state verify pulse 1510 (VvINT). The pulse train is an example of a first set of step-wise increasing program voltages. Vpgm_init1 is the initial program voltage, and can be different for each programming pass.

A pulse train typically includes program pulses which increase stepwise in amplitude in one or more program loops or program loops of a programming pass using a fixed or varying step size. In some cases, the program pulses increase in each program loop after the first. A new pulse train can be applied in each programming pass, starting at an initial level and ending at a final level which does not exceed a maximum allowed level. The initial levels can be the same or different in different programming passes. The final levels can also be the same or different in different programming passes. The step size can be the same or different in the different programming passes. In some cases, a smaller step size is used in a final programming pass to reduce Vth distribution widths.

FIG. 16 depicts a series of program loops in an example of a programming pass for an upper page of data, consistent with FIG. 12C. The pulse train 1600 includes a series of program pulses 1601-1615 that are applied to a word line selected for programming. The pulse train 1600 is an example of a second set of step-wise increasing program voltages. Vpgm_init2 is the initial program voltage. One, two or three verify pulses are provided after each program pulse as an example, based on the assigned data states which are being verified. For example, an A-state verify pulse 1620 (VvA) is applied in program loops 1-3, A-state and B-state verify pulses 1621 (VvA and VvB, respectively) are applied in program loops 4-6, A-state, B-state and C-state verify pulses 1622 (VvA, VvB and VvC, respectively) are applied in program loops 7 and 8, B-state and C-state verify pulses 1623 are applied in program loops 9-11, and a C-state verify pulse 1624 is applied in program loops 12-15.

FIG. 17A to 17E depicts example plots of voltages used in the sensing process of FIG. 14A. A common time line on a horizontal axis is used in these figures while the vertical axis in each figure represents a voltage.

FIG. 17A depicts an example plot 1700 of a voltage on a selected word line, Vwl_sel. In this example, the sensing process is a read operation of a page of data which uses control gate read levels of VrA and VrC, consistent with the four-state example of FIG. 11A. Generally, one or more control gate read levels may be used. The voltage is initially at 0 V and is set to VrA at t7-t9, Vrc from t9-t11, Vread pass from t11-t12 and then ramped down to 0 V at t12-t13. VrA can be about 0-0.5 V in some examples, while VrC might be about 4 V. Optionally, after the sensing occurs at the two control gate read levels of VrA and VrC, Vwl_sel is increased to Vread pass before ramping it down to 0 V at the same time Vwl_unsel is ramped down (FIG. 17E or 17F) to further help reduce disturbs.

FIG. 17B depicts an example plot 1710 of a voltage on a bit line, Vbl. A steady state voltage, e.g., 0 V, is applied initially, and a sensing voltage, Vbl sense, e.g., 2-3 V, is applied from t1-t13. Sensing of the memory cells occurs at time period beginning at t8 and t10. During sensing of the memory string, for each control gate read voltage, Vbl may remain relatively steady or may decay. The case with a bit line decay is depicted by plots 1710a and 1710b. If Vbl decays below a specified trip level, the selected memory string is considered to be in a conductive state and the Vth of the selected memory cell is below the demarcation voltage. If Vbl does not decay below the trip point, the selected memory string is considered to be in a non-conductive state and the Vth of the selected memory cell is equal to or above the demarcation voltage. Note that the bit lines are common in the selected and unselected blocks.

FIG. 17C depicts an example plot 1720 of a voltage on a source line, Vsl. The source line is common in the selected and unselected blocks, in one approach. In one approach, Vsl remains at a steady state voltage such as 0 V throughout the sensing process. Optionally, Vsl is provided at a slightly elevated level such as 0-1 V during sensing.

FIG. 17D depicts an example plot 1730 of a voltage on connected SGS transistors in a block, Vsgs, and a voltage on SGD transistors of a selected sub-block, Vsgd_sel. These voltages are provided at an elevated level such as 4 V during sensing, e.g., from W413 so that a current can flow in the selected memory strings. The elevated level is higher than the Vth of the selected gate transistors so that they will be in a conductive or on state.

FIG. 17E depicts an example plot 1740 of a voltage on unselected word lines, Vwl_unsel, and an example plot 1741 of a voltage on SGD transistors of an unselected sub-block, Vsgd_unsel, consistent with step 1405a of FIG. 14A. Vw_unsel increases from 0 V to Vread pass, e.g., 8 V, in the time period of t1-t4. In one approach, Vw_unsel is increased based on a control signal to a voltage driver which changes the requested output of the voltage driver in a step change. In another approach, Vw_unsel is increased based on a control signal to a voltage driver which changes the requested output of the voltage driver more gradually, in a ramp.

During the time period in which Vwl_unsel is increased, the control gate voltage of Vsgd_unsel is increased to a level such as 4 V, which is sufficiently high to provide the associated SGD transistors of the unselected sub-blocks temporarily in a conductive state. These SGD transistors become conductive for a first time period dt1 when the control gate voltage exceeds the Vth of these transistors. Here, the increase and decrease of Vsgd_unsel occurs between t2-t3. See also FIGS. 18A and 18B. The SGD transistors of the unselected sub-blocks can be provided in the conductive state at a start of the increase of Vwl_unsel, after the start but before the end, or at the end of the increase of Vwl_unsel, for instance. The SGD transistors are provided in the conductive state throughout a first time period in this example. In theory, these SGD transistors could be provided in the conductive state throughout multiple separate time periods, if the time of the increase of Vwl_unsel was sufficiently long. The increase of Vwl_unsel can be continuous or can occur in multiple segments with a ramp followed by a steady state period followed by another ramp, for instance. As discussed, e.g., in connection with the plot 920 in FIG. 9B, by providing these SGD transistors temporarily in a conductive state, the channel boosting level can be reduced at the drain-ends of the memory strings of the unselected sub-blocks. This in turn reduces the channel gradient and the associated worst-cased read disturb on the memory cells of WLn+1.

Note that in a situation in which the read countermeasure is not used, e.g., the unselected SGD transistors are not provided in the conductive state during the ramp up of Vwl_unsel, Vwl_unsel can potentially be ramped up in a shorter time period, e.g., at a faster rate, so that the sensing process can be completed is less time.

FIG. 17F depicts another example plot 1750 of Vwl_unsel, and an example plot 1751 of Vsgd_unsel, consistent with step 1405a of FIG. 14A, where the increase of Vwl_unsel occurs over a longer time period than in FIG. 17E, and the peak level of Vsgd_unsel occurs over a longer time period than in FIG. 17E. The increase or ramp up of Vwl_unsel occurs over the time period t1-t6 here compared to t1-t4 in FIG. 17E. By providing the increase over a longer time period, additional time is also provided to set the Vsgd_unsel at the desired level. Note that the channel boosting of the memory strings in the unselected sub-blocks is caused by capacitive coupling from the unselected word lines to the channels. This boosting is a function of the increase in Vwl_unsel rather than how quickly Vwl_unsel increases. A slower ramp up of Vwl_unsel will therefore not reduce the channel boosting (when the SGD is off and such boosting occurs).

Note that the ramp up time of the unselected word lines does not necessarily have to change to accommodate different time periods in which the SGD transistors are conductive. For example, the ramp up time of the unselected word lines in FIG. 17E can be sufficient to accommodate different conductive time periods, e.g., first and second time periods as described herein, for the unselected SGD transistors.

FIG. 18A depicts a close up view of the plot 1741 of Vsgd_unsel in FIG. 17E and a plot 1742 of a control signal for a voltage driver, where Vsgd_unsel reaches a peak requested level of Vpeak_req. A control signal (plot 1742) can be provided to a voltage driver for the unselected SGD transistors in each unselected sub-block to provide a corresponding output voltage of Vsgd_unsel (plot 1741) for each unselected sub-block. The control signal can be provided with a step change from an initial level such as 0 V to a requested peak level (Vpeak_req, e.g., 4 V). The time points of t2 and t3 here are consistent with FIG. 17E. Additional intermediate time points t2a-t2d are also depicted. Before t2, the control signal requests an output of 0 V. At t2, the control signal first requests an output of Vpeak_req. Between t2-t2c, the control signal continues to request Vpeak_req. At t2c, the control signal again requests the output of 0 V and this request is maintained after t2c.

The output voltage, Vsgd_unsel, is delayed relative to the requested level. Plot 1741 shows that Vsgd_unsel increases above the Vth of the SGD transistors at t2a, at which time the SGD transistors of the unselected sub-blocks transition to the conductive state from the non-conductive state. Vsgd_unsel continues to increase from t2a-t2b until it reaches Vpeak_req at t2b. Vsgd_unsel is maintained at Vpeak_req from t2b-t2c, and begins to decrease at t2c. Vsgd_unsel decreases from Vpeak_req to Vth from t2c-t2d. When Vsgd_unsel decreases below Vth at t2d, the SGD transistors of the unselected sub-blocks transition to the non-conductive state from the conductive state. The SGD transistors are therefore conductive from t2a-t2d in a first time period of dt1. Vsgd_unsel continues to decrease until t3.

FIG. 18B depicts an alternative case of a plot 1760 of Vsgd_unsel and a plot 1761 of a control signal for a voltage driver, where Vsgd_unsel does not reach a peak requested level of Vpeak_req. In this example, the amount of time in which Vpeak_req is requested by the control signal (e.g., t2-t2e) is not sufficient for Vsgd_unsel to reach Vpeak_req. However, the amount of time in which Vpeak_req is requested is sufficient for Vsgd_unsel to reach Vth and enter the conductive state. Specifically, before t2, the control signal requests an output of 0 V. At t2, the control signal first requests an output of Vpeak_req. Between t2-t2e, the control signal continues to request Vpeak_req. At t2e, the control signal again requests the output of 0 V and this request is maintained after t2e.

Plot 1760 shows that Vsgd_unsel increases above the Vth of the SGD transistors at t2a, at which time the SGD transistors of the unselected sub-blocks transition to the conductive state from the non-conductive state. Vsgd_unsel continues to increase from t2a-t2e until it reaches a peak level of Vpeak, which is less than Vpeak_req, at t2e. Vsgd_unsel begins to decrease at t2e. Vsgd_unsel decreases from Vpeak to Vth from t2e-t2f. When Vsgd_unsel decreases below Vth at t2f, the SGD transistors of the unselected sub-blocks transition to the non-conductive state from the conductive state. Vsgd_unsel continues to decrease until t2g. The SGD transistors are therefore conductive from t2a-t2f in a first time period of dt1 a.

FIG. 19A depicts a cross-sectional view of a pillar 1900 in which a memory string is provided, where the pillar tapers continuously from top to bottom, and a plot of an SGD_unsel on (conductive) period versus a selected word line position in the memory string, consistent with step 1405a of FIG. 14A. As described in connection with FIGS. 6A and 6C, a memory string can be formed by a pillar in a memory hole. The memory hole is etched through the stack of alternating control gate and dielectric layers. Due to the depth of the memory hole, it is difficult to obtain a consistent memory hole diameter or width. Typically, the memory hole tapers from a larger diameter at its top to a smaller diameter at its bottom. In some cases, the maximum diameter is slightly below the top of the memory hole. In this example, the entire stack is formed and the memory hole is etched from the top of the stack to the bottom. The diameter at the top is d2 and the diameter at the bottom is d1. The pillar has a dielectric core 1903, a channel layer 1902, and additional layers 1901, e.g., a blocking oxide, a charge-trapping layer and a tunneling layer.

Further, the pillar is divided into regions 1910, 1920 and 1930. The regions can be similar in height and encompass a similar number of word lines, in one approach. The region 1910 extends from a height 0-h1a, where 0 represents a source-end of the memory string at the bottom of the pillar. The region 1920 extends from h1a-h1b. The region 1930 extends from h1b-h1c, where h1c represents a drain-end of the memory string at the top of the pillar. Each region is associated with a subset of word lines which are located within the height range encompassed by the region. For example, the regions 1910, 1920 and 1930 may be associated with the subsets 790, 791 and 792, respectively, in FIG. 7 which represent source-end, midrange and drain-end subsets of word lines, respectively. Other subsets of word lines are possible as well. For example, two or more subsets can be provided. The time period of the read disturb countermeasure can be a function of the selected word line position.

For example, the first time period in which the unselected SGD transistors (the SGD transistors in the unselected sub-blocks) are conductive can be a function of the subset in which the selected word line is located.

The plot 1911 shows an SGD_unsel on period on a horizontal axis versus WLsel (selected word line) position on a vertical axis. The SGD_unsel on period is the time period in which the unselected SGD transistors are conductive, while Vwl_unsel is increased to Vread pass. This time period is dt1 in FIG. 18A and dt1a in FIG. 18B, for example. Note that it is also possible for the SGD_unsel on period to be replaced by the time period in which the control signal of the corresponding voltage driver requests Vpeak_req as this metric may be more readily available to the control. This time period is t2-t2c in FIG. 18A and t2-t2e in FIG. 18B, for example. The SGD_unsel on period will increase as the Vpeak_req period increases.

The plot 1911 shows a step change from tp1 to tp2 over one word line while the plot 1912 shows the optional for a gradual change from tp1 to tp2 over multiple word lines.

The SGD_unsel on period is tp1 when the selected word line is in the source-end or midrange subsets of regions 1910 and 1920, respectively, and tp2 when the selected word line is in the drain-end subset of region 1930, where tp1>tp2. Thus, the first time period in which the unselected SGD transistors are conductive, during the increase of the voltage of the unselected word lines from an initial level to a read pass level, is greater when the selected word line is in the source-end subset or the midrange subset than when the selected word line is in the drain-end subset. MP denotes a midpoint of the pillar, which is half way between the top and bottom. The MP is within the region 1930 and the midrange subject of word lines.

FIG. 19B depicts a cross-sectional view of a pillar 1950 in which a memory string is provided, where the pillar tapers in two pillar portions 1951 and 1952, and a plot of an SGD_unsel on (conductive) period versus a selected word line position in the memory string, consistent with step 1405a of FIG. 14A. Due to the height of the stack, it can be desirable to form the stack and the corresponding memory holes and pillars in portions. For example, a first portion of the stack may be formed with a pillar portion 1952 after which a second portion of the stack is formed with a pillar portion 1951. Each pillar portion tapers from a larger diameter at its top to a smaller diameter at its bottom. For example, the pillar portion 1952 tapers from a larger diameter d4 at its top to a smaller diameter d3 at its bottom. And, the pillar portion 1951 tapers from the larger diameter d4 at its top to the smaller diameter d3 at its bottom. In this example, the top diameters are the same and the bottom diameters are the same, but this is optional. The pillar 1950 has a local minimum diameter (d3) at the midpoint MP.

The pillar is divided into regions 1960, 1961 and 1962. The region 1960 extends from a height 0-h2a, where 0 represents a source-end of the memory string at the bottom of the pillar. The region 1961 extends from h2a-h2b. The region 1962 extends from h2b-h2c, where h2c represents a drain-end of the memory string at the top of the pillar. As in FIG. 19A, each region is associated with a subset of word lines which are located within the height range encompassed by the region. The region 1961 is smaller than the other regions, in this example, so it would encompass fewer word lines. Referring to FIG. 7, in one example, the regions 1960, 1961 and 1962 might encompass the seven word lines WLDS0-WLL4, the three word lines WLL5-WLL7 and the five word lines WLL8-WLDD0, respectively. Thus, the regions encompass different numbers of word lines. This allows the read disturb countermeasure to be optimized for the region 1961 which encompasses the local minimum in the pillar diameter. Due to this local minimum, the electric field caused by the word line voltage will be relatively stronger so that a larger channel gradient may be generated and the likelihood of read disturb is increased. As a result, the read disturb countermeasure can be made stronger for this region, e.g., by increasing the SGD_unsel on period.

The plot 1970 shows an SGD_unsel on period on a horizontal axis versus WLsel position on a vertical axis. The SGD_unsel on period is tp1 when the selected word line is in the source-end subset of word lines corresponding to the region 1960, tp3 when the selected word line is in the midrange subset of word lines corresponding to the region 1961 and tp2 when the selected word line is in the drain-end subset of word lines corresponding to the region 1962, where tp3>tp2>tp1. SGD_unsel on is thus a maximum when the selected word line is at the midpoint of the pillar and/or within a subset of word lines which encompasses the local minimum in the pillar diameter. The local minimum in the pillar diameter refers, e.g., to a minimum which is between the top and bottom of the pillar.

In one implementation, an apparatus comprises: a plurality of memory strings extending vertically in a stack, each memory string comprising a source-end select gate transistor, a drain-end select gate transistor, and memory cells between the source-end select gate transistor and the drain-end select gate transistor, wherein the plurality of memory strings are arranged in a plurality of sub-blocks; a plurality of word lines connected to the memory cells, each word line connected to memory cells in each sub-block, the plurality of word lines comprise a source-end subset of word lines (790) adjacent to the source-end select gate transistors, a drain-end subset of word lines (792) adjacent to the drain-end select gate transistors, and a midrange subset of word lines (791) between the source-end subset of word lines and the drain-end subset of word lines; and a control circuit. The control circuit is configured to: increase a voltage of unselected word lines among the plurality of word lines from an initial level to a read pass level; provide a voltage of a selected word line among the plurality of word lines at a control gate read level; during the increase, provide the source-end select gate transistors in the plurality of sub-blocks in a conductive state, and provide drain-end select gate transistors in one unselected sub-block of the plurality of sub-blocks (e.g., SB1) in a conductive state throughout a first time period, wherein the first time period is greater when the selected word line is in the source-end subset or the midrange subset than when the selected word line is in the drain-end subset; and after the increase, while the voltage of the unselected word lines is at the read pass level, the voltage of the selected word line is at a control gate read level and the drain-end select gate transistors in the one unselected sub-block are in a non-conductive state, sense a conductive state of memory cells connected to the selected word line.

In another implementation, a method comprises: throughout a time period (e.g., t1-t4 in FIG. 17E or t1-t6 in FIG. 17F), increasing a voltage of unselected word lines among a plurality of word lines from an initial level to a read pass level, wherein the plurality of word lines are connected to memory cells in memory strings, and each memory string comprises a source end and a drain end, providing the source ends of the memory strings in a conductive state, and providing the drain ends of a selected subset (e.g., SB0) of the memory strings in a non-conductive state; during one interval of the time period (e.g., t2a-t2d in FIG. 18A and t2a-t2f in FIG. 18B), providing the drain ends of an unselected subset of the memory strings in a conductive state; during another interval of the time period (e.g., t2d-t4 in FIGS. 17E and 18A and t2f-t6 in FIGS. 17F and 18B), providing the drain ends of the unselected subset of the memory strings in a non-conductive state; and after the time period, providing a control gate read voltage on a selected word line among a plurality of word lines while providing the drain-ends of the unselected subset in the non-conductive state and sensing memory cells connected to the selected word line in the selected subset of the memory strings, wherein the one interval is greater when the selected word line is at a midway point between the source ends and the drain ends than when the selected word line is between the midway point and the drain ends.

In another implementation, an apparatus comprises: a plurality of memory strings, each memory string comprising memory cells between a source-end select gate transistor and a drain-end select gate transistor, and the plurality of memory strings comprise memory strings in a selected sub-block and memory strings in an unselected sub-block; a plurality of word lines connected to the memory cells, the word lines comprise a selected word line and unselected word lines; means for increasing voltages of the unselected word lines from an initial level to a read pass level during a time period (e.g., t2a-t2d in FIG. 18A and t2a-t2f in FIG. 18B); means for providing the source-end select gate transistors in a conductive state during the increasing of the voltages; means for determining that the memory strings in the unselected sub-block are programmed; means for providing the drain-end select gate transistors for the memory strings in the unselected sub-block in a conductive state during a portion (e.g., t1-t4 in FIG. 17E or t1-t6 in FIG. 17F) of the time period in response to the means for determining; and means for sensing currents in the memory strings in the selected sub-block while the drain-end select gate transistors for the memory strings in the unselected sub-block in a non-conductive state, drain-end select gate transistors for the memory strings in the selected sub-block in the conductive state and the source-end select gate transistors are in the conductive state.

The means described above can include the components of the memory device 100 of FIG. 1-4, for example. The power control module 116, for instance, controls the power and voltages supplied to the word lines, select gate lines and bit lines during memory operations. The SGD drivers and SGS drivers of FIG. 4c can be used. The means can further include any of the control circuits in FIGS. 1 and 2 such as the control circuitry 110 and controller 122.

The foregoing detailed description of the invention has been presented for purposes of illustration and description. It is not intended to be exhaustive or to limit the invention to the precise form disclosed. Many modifications and variations are possible in light of the above teachings. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

We claim:

1. An apparatus, comprising:
    a plurality of NAND strings extending vertically in a stack, each NAND string comprising a source-end select gate transistor, a drain-end select gate transistor, and memory cells between the source-end select gate transistor and the drain-end select gate transistor, wherein the plurality of NAND strings are arranged in a plurality of sub-blocks of a block;
    a plurality of word lines connected to the memory cells, each word line connected to memory cells in each sub-block, the plurality of word lines comprise a source-end subset of word lines adjacent to the source-end select gate transistors, a drain-end subset of word lines adjacent to the drain-end select gate transistors, and a midrange subset of word lines between the source-end subset of word lines and the drain-end subset of word lines; and
    a control circuit, the control circuit configured to:
        increase a voltage of unselected word lines among the plurality of word lines from an initial level to a read pass level;
        provide a voltage of a selected word line among the plurality of word lines at a control gate read level;
        throughout the increase, provide the source-end select gate transistors in the plurality of sub-blocks in a conductive state;
        provide drain-end select gate transistors in one unselected sub-block of the plurality of sub-blocks in a conductive state throughout a first time period during the increase, wherein the first time period is greater when the selected word line is in the midrange subset and half way between a top and a bottom of the plurality of NAND strings than when the selected word line is in the drain-end subset; and
        after the increase, while the voltage of the unselected word lines is at the read pass level, the voltage of the selected word line is at a control gate read level and the drain-end select gate transistors in the one unselected sub-block are in a non-conductive state, sense a conductive state of memory cells connected to the selected word line.

2. The apparatus of claim 1, wherein:
the control circuit is configured to provide the drain-end select gate transistors in the one unselected sub-block in the conductive state for the first time period in response to a determination that the one unselected sub-block comprises programmed memory cells connected to the selected word line.

3. The apparatus of claim 1, wherein:
throughout the increase, provide drain-end select gate transistors in another unselected sub-block of the plurality of sub-blocks in the non-conductive state, in response to a determination that the another unselected sub-block does not comprise programmed memory cells connected to the selected word line.

4. The apparatus of claim 1, wherein:
during the increase, provide drain-end select gate transistors in another unselected sub-block of the plurality of sub-blocks in a conductive state throughout a second time period which is shorter than the first time period, in response to a determination that the another unselected sub-block does not comprise programmed memory cells connected to the selected word line.

5. The apparatus of claim 1, wherein:
the control circuit is configured to, during the increase, provide the drain-end select gate transistors in the one unselected sub-block in the non-conductive state throughout a second time period; and
voltages of channels of some NAND strings in the one unselected sub-block are boosted during the second time period by capacitive coupling.

6. The apparatus of claim 5, wherein:
during the increase, channels of the some NAND strings are cutoff at the selected word line when the voltage of the selected word line is at the control gate read level, so that a voltage floats in a portion of the channels between the selected word line and the drain-end select gate transistors in the one unselected sub-block.

7. The apparatus of claim 1, wherein:
the first time period is less than a time period in which the increase occurs.

8. The apparatus of claim 1, wherein:
the plurality of NAND strings extend vertically in the stack through memory holes; and
each memory hole has a diameter which is a local minimum at a point half way between the top and the bottom of the memory hole, in the midrange subset; and
the first time period is greater when the selected word line is at the local minimum than when the selected word line is in the source-end subset.

9. The apparatus of claim 1, wherein:
the control circuit is configured to provide the increase over a relatively shorter time period when the first time period is relatively shorter.

10. A method, comprising:
throughout a time period: increasing a voltage of unselected word lines among a plurality of word lines from an initial level to a read pass level, wherein the plurality of word lines are connected to memory cells in NAND strings in a block, and each NAND string comprises a source-end select gate transistor and a drain-end select gate transistor, providing the source-end select gate transistors of the block in a conductive state, and providing the drain-end select gate transistors of a selected subset of the NAND strings in a non-conductive state;
during one interval of the time period, providing the drain end select gate transistors of an unselected subset of the NAND strings in a conductive state;
during another interval of the time period, providing the drain end select gate transistor of the unselected subset of the NAND strings in a non-conductive state; and
after the time period, providing a control gate read voltage on a selected word line among the plurality of word lines while providing the drain-end select gate transistors of the unselected subset in the non-conductive state and sensing memory cells connected to the selected word line in the selected subset of the NAND strings, wherein the one interval is greater when the selected word line is at a midpoint half way between the source-end select gate transistors and the drain-end select gate transistors than when the selected word line is between the midpoint and the drain-end select gate transistor.

11. The method of claim 10, further comprising:
adjusting the time period as a function of the one interval.

12. The method of claim 10, wherein:
the one interval is smaller when the selected word line is adjacent to the drain-end select gate transistors than when the selected word line is adjacent to the source-end select gate transistor.

13. The method of claim 10, wherein:
each NAND string in the unselected subset of the NAND strings comprises a channel which extends continuously from the source-end select gate transistor to the drain-end select gate transistor; and
voltages of the channels are boosted from capacitive coupling from the increasing of the voltage of the unselected word lines during the another interval of the time period but not during the one interval of the time period.

14. The method of claim 10, wherein:
control gates of the source-end select gate transistors are connected by a common conductive layer; and
the source end select gate transistors are provided in the conductive state by providing a voltage on the common conductive layer which is higher than threshold voltages of the source-end select gate transistors.

15. The method of claim 10, wherein:
control gates of the drain-end select gate transistors of the selected subset of the NAND strings are connected; and
control gates of the drain-end select gate transistors of the unselected subset of the NAND strings are connected.

16. An apparatus, comprising:
a plurality of NAND strings in a block, each NAND string comprising memory cells between a source-end select gate transistor and a drain-end select gate transistor, the plurality of NAND strings comprise NAND strings in a selected sub-block of the block and NAND strings in an unselected sub-block of the block, and control gates of each of the source-end select gate transistors in the block are connected to one another;
a plurality of word lines connected to the memory cells, the word lines comprise a selected word line and unselected word lines; and
means for increasing voltages of the unselected word lines from an initial level to a read pass level during a time period;
means for providing the source-end select gate transistors in the block in a conductive state throughout the increasing of the voltages;
means for providing the drain-end select gate transistors for the NAND strings in the unselected sub-block in a conductive state during a portion of the time period, when the NAND strings in the unselected sub-block are programmed;
means for providing the drain-end select gate transistors for the NAND strings in the unselected sub-block in a non-conductive state throughout the time period when the NAND strings in the unselected sub-block are unprogrammed; and
means for sensing currents in the NAND strings in the selected sub-block while the drain-end select gate transistors for the NAND strings in the unselected sub-block are in the non-conductive state, drain-end select gate transistors for the NAND strings in the selected sub-block are in the conductive state and the source-end select gate transistors are in the conductive state.

17. The apparatus of claim 16, wherein:
a duration of the portion is based on a position of the selected word line among the plurality of word lines.

18. The apparatus of claim 17, wherein:
the duration is longer when the selected word line is at a midway point half way between the source-end select gate transistors and the drain-end select gate transistors than when the selected word line is between the midway point and the drain-end select gate transistors.

19. The apparatus of claim 1, wherein:
the first time period is greater when the selected word line is in a source-end subset of word lines of the plurality of word lines than when the selected word line is in the drain-end subset.

20. The apparatus of claim 1, wherein:
the control circuit is configured to set a duration of the first time period based on whether or not the one unselected sub-block is programmed, the duration is shorter when the one unselected sub-block is programmed than when the one unselected sub-block is not programmed.

* * * * *